(12) United States Patent
Arai et al.

(10) Patent No.: US 8,018,006 B2
(45) Date of Patent: Sep. 13, 2011

(54) SEMICONDUCTOR DEVICE HAVING AN ENLARGED SPACE AREA SURROUNDING AN ISOLATION TRENCH FOR REDUCING THERMAL RESISTANCE AND IMPROVING HEAT DISSIPATION

(75) Inventors: Mitsuru Arai, Kodaira (JP); Shinichiro Wada, Fuchu (JP); Hideaki Nonami, Ome (JP)

(73) Assignees: Hitachi ULSI Systems Co., Ltd., Tokyo (JP); Hitachi, Ltd., Tokyo (JP)

( * ) Notice: Subject to any disclaimer, the term of this patent is extended or adjusted under 35 U.S.C. 154(b) by 0 days.

(21) Appl. No.: 12/759,188

(22) Filed: Apr. 13, 2010

(65) Prior Publication Data
US 2010/0314712 A1    Dec. 16, 2010

Related U.S. Application Data

(63) Continuation-in-part of application No. 12/372,847, filed on Feb. 18, 2009, now Pat. No. 7,696,582, which is a continuation of application No. 11/334,498, filed on Jan. 19, 2006, now Pat. No. 7,569,895.

(30) Foreign Application Priority Data

Feb. 4, 2005    (JP) .................................. 2005-028374

(51) Int. Cl.
*H01L 21/70* (2006.01)
(52) U.S. Cl. ........ 257/374; 257/273; 257/378; 257/518; 257/520; 257/198; 438/207; 438/318
(58) Field of Classification Search ........... 257/E21.166, 257/374, 378, 518, 520, 198; 438/207, 318
See application file for complete search history.

(56) References Cited

U.S. PATENT DOCUMENTS 4,949,151 A * 8/1990 Horiuchi et al. .............. 257/508
(Continued)

FOREIGN PATENT DOCUMENTS

JP         52-141589          11/1977
(Continued)

OTHER PUBLICATIONS

Office Action in JP 2005-028374, dated Jan. 18, 2011, (3 pgs.), with English language translation (7 pgs).
(Continued)

*Primary Examiner* — Lex Malsawma
*Assistant Examiner* — Thanh Y Tran
(74) *Attorney, Agent, or Firm* — Antonelli, Terry, Stout & Kraus, LLP

(57) ABSTRACT

A semiconductor device includes a lower substrate, a thin semiconductor layer and an insulating layer formed between the lower substrate and the semiconductor layer. An active transistor area is formed with a base formed along a surface of the semiconductor layer, an emitter region formed in the base, a buried collector in the thin semiconductor layer to contact the insulating layer, a collector contacting the buried collector, and emitter, collector and base contacts. The active transistor area is configured to operate at an emitter current at least in the order of mA (milli-ampere). An isolation trench extends through the semiconductor layer to the insulating layer and surrounds the active transistor area with a distance in the order of μm (micron) from the active transistor area and with a space area of more than 50 μm$^2$ between the active transistor area and the isolation trench.

5 Claims, 18 Drawing Sheets

U.S. PATENT DOCUMENTS

| | | | |
|---|---|---|---|
| 5,374,844 A | 12/1994 | Moyer | |
| 5,850,099 A | 12/1998 | Liu | |
| 7,569,895 B2 | 8/2009 | Arai et al. | |
| 7,576,406 B2 * | 8/2009 | Tamaki et al. | 257/526 |
| 2004/0183159 A1 | 9/2004 | Tamaki et al. | |
| 2006/0175635 A1 | 8/2006 | Arai et al. | |

FOREIGN PATENT DOCUMENTS

| | | |
|---|---|---|
| JP | 55-061059 | 5/1980 |
| JP | 61-168959 | 7/1986 |
| JP | 61-208260 | 9/1986 |
| JP | 63-202965 | 8/1988 |
| JP | 63-301555 | 8/1988 |
| JP | 64-031452 | 2/1989 |
| JP | 02-232929 | 9/1990 |
| JP | 6-342803 | 12/1994 |
| JP | 2002-057219 | 8/2000 |
| JP | 2002-299466 | 10/2002 |

OTHER PUBLICATIONS

Chen, Tianbing et al; Footprint Design Optimization in SiGe BiCMOS SOI Technology: IEEE BCTM 13.2, copyright 2008, (pp. 208-211) (in English).

* cited by examiner

SEMICONDUCTOR DEVICE HAVING AN ENLARGED SPACE AREA SURROUNDING AN ISOLATION TRENCH FOR REDUCING THERMAL RESISTANCE AND IMPROVING HEAT DISSIPATION

CROSS-REFERENCE TO RELATED APPLICATIONS

The present application is a continuation-in-part of U.S. application of Ser. No. 12/372,847, filed Feb. 18, 2009 now U.S. Pat. No. 7,696,582 which is a continuation of U.S. application Ser. No. 11/334,498, filed Jan. 19, 2006 (now U.S. Pat. No. 7,569,895), and which application claims priority from Japanese application JP 2005-028374 filed on Feb. 4, 2005, the contents of which are hereby incorporated by reference into this application.

FIELD OF THE INVENTION

The present invention concerns an improvement for the heat dissipation of a bipolar transistor and, more in particular, it relates to an improvement for the heat dissipation of a semiconductor device which is an effective when applied to an insulated device isolation type bipolar transistor.

BACKGROUND OF THE INVENTION

JP-A No. 2002-299466 is a document that discloses an insulated device isolation type bipolar transistor technique on an SOI (Silicon On Insulator) substrate. Particularly, FIG. 2 of the document shows an example of planar and cross sectional structures of a unit bipolar transistor. Further, FIG. 4 of the document shows an example of the arrangement for interconnections when multiple unit bipolar transistors are connected in parallel. Further, FIG. 21 of the document shows an example of a cross sectional structure of a multi-emitter type unit bipolar transistor.

SUMMARY OF THE INVENTION

The present inventors have found that the prior art described above involves the following problems.

The structure of a unit bipolar transistor in the prior art is designed, for improving the performance and increasing the integration degree of devices, to a minimum layout dimension or a dimension approximate to the minimum layout dimension and it has been found that when the unit bipolar transistor is operated at a high voltage or a high current, characteristics thereof are sometimes degraded by the self-heating effect.

Further, in a case of using a plurality of unit bipolar transistors connected in parallel, it has been found that the amount of heat generation is higher for unit bipolar transistors arranged in a central portion than that for the unit bipolar transistors arranged at the periphery, and scattering of temperature at the junction for each of the unit bipolar transistors gives an effect on the scattering of device characteristic of the transistors.

Further, in a case of using a plurality of unit bipolar transistors connected in parallel, when emitter interconnections are extended in the direction of each row, it has been found that the unit bipolar transistors arranged at the portion with low emitter interconnection resistance cause thermal runaway under the self-heating effect leading to destruction due to the difference of emitter interconnection resistance between the unit bipolar transistors arranged at a portion with low emitter interconnection resistance and unit bipolar transistors arranged at a portion with high emitter interconnection resistance, when the unit bipolar transistors are operated at a high voltage or a high current.

The present invention intends to provide a technique capable of improving the heat dissipation of an insulated device isolation type bipolar transistor.

The invention further intends to provide a technique capable of reducing capacitance relative to a substrate in a case of using a plurality of unit bipolar transistors connected in parallel.

The outline for typical inventions among those disclosed in the present application is simply described as below.

That is, the present invention has a structure in a semiconductor device in which bipolar transistors are formed in a plurality of device forming regions electrically isolated from each other by device isolation trenches traversing a semiconductor layer, wherein a device isolation trench for each of unit bipolar transistor constituting the plurality of bipolar transistors connected in parallel is removed, and the plurality of bipolar transmitters are entirely surrounded with a device isolation trench.

Further, in the invention, a distance between the emitter of the unit bipolar transistor and the device isolation trench is enlarged.

(1) In a first aspect, the invention provides a semiconductor device having a plurality of bipolar transistors connected in parallel in a plurality of device forming regions electrically isolated from each other by device isolation trenches traversing a semiconductor layer, in which the device isolation trenches are removed, the plurality of bipolar transistors are entirely surrounded with one device isolation trench, and buried collector regions for the bipolar transistors are disposed being spaced apart from each other. (2) In a second aspect, the invention provides a semiconductor device having a plurality of bipolar transistors connected in parallel in a plurality of device forming regions electrically isolated from each other by device isolation trenches traversing a semiconductor layer, in which the device isolation trenches are removed, the plurality of bipolar transistors are entirely surrounded with one device isolation trench, and buried collector regions for each of adjacent bipolar transistors are arranged in contact with each other. (3) In a third aspect, the invention provides a semiconductor device having a plurality of bipolar transistors connected in parallel in a plurality of device forming regions electrically isolated from each other by device isolation trenches traversing a semiconductor layer, in which the device isolation trenches are removed, the plurality of bipolar transistors are entirely surrounded with one device isolation trench, and the buried collector region for the bipolar transistor disposed at the outermost periphery and the device isolation trench are disposed being spaced apart from each other. (4) In a fourth aspect, the invention provides a semiconductor device having a plurality of bipolar transistors connected in parallel in a plurality of device forming regions electrically isolated from each other by device isolation trenches traversing a semiconductor layer, in which the device isolation trenches are removed, the plurality of bipolar transistors are entirely surrounded with one device isolation trench, and the buried collector region for the bipolar transistors disposed at the outer most periphery and the device isolation trench are disposed being spaced apart from each other. (5) In the semiconductor device as described in (1) or (4) above, it is preferred that a depletion region with the low concentration layer is between the buried collector region of the bipolar transistor and the device isolation trench. (6) In the semiconductor device as described in (1) above, it is preferred that the device isolation trench is disposed being spaced apart from the emitter region of the bipolar transistor and the end of the buried collector region of the bipolar transistor is disposed being enlarged and spaced from the emitter region of the bipolar transistor. (7) In the semiconductor device as described in (1) above, it is preferred that the device isolation trench is disposed being remote from the emitter region of the bipolar transistor and being enlarged, and the buried collector region of the bipolar transistor is spaced apart from the device isolation trench. (8) In the semiconductor device as described in (3), (4), or (7) above, it is preferred that a depletion region with a low concentration layer is formed between the buried collector region of the bipolar transistor and the device isolation trench. (9) In the semiconductor device as described in (1) above, it is preferred that bipolar transistors are arranged thinly in the central portion and densely in the peripheral portion. (10) In the semiconductor device as described in (1) above, it is preferred that the emitter interconnection is extended in the direction of each row (or column), and the number of the bipolar transistors in the direction of each row (column) is made less than the number of the bipolar transistors in the direction of the column (or row).

Typical effects of the invention obtained by the means described above are that the heat dissipation of the bipolar transistors formed in the device forming regions isolated from each other by the device isolation trenches can be improved.

BRIEF DESCRIPTION OF THE DRAWINGS

FIGS. 5A to 5D show a result of confirming the effect of the embodiment shown in FIGS. 4A and 4B by electrical characteristics in which FIG. 5A shows the dependence of the thermal resistance Rth of the unit transistor on the device isolation trench area;

FIG. 5B shows the dependence of a device destruction power by the self-heating effect of the unit transistor on the device isolation trench area;

FIG. 5C shows the dependence of a current gain cut-off frequency fT on the device isolation trench area;

FIG. 5D shows the dependence of a collector current (IC@fTpeak) at the maximum current gain cut-off frequency fT peak on the device isolation trench area;

FIGS. 9A and 9B show an embodiment of the invention in which a plurality of unit transistors are connected in parallel; in which FIG. 9A is a plan view in which individual device isolation trenches for a plurality of unit transistors connected in parallel of the existent structure shown in FIGS. 8A and 8B are removed and the unit transistors connected in parallel are entirely surrounded with one device isolation trench;

FIG. 9B is a cross sectional view taken along line X1-X1 in FIG. 9A in a case where the unit transistor is an npn type;

FIGS. 12A to 12C show a result of confirming the effect of the embodiment shown in FIG. 10 by electrical characteristics, in which FIG. 12A shows IC-VCB characteristics in a case where the existent unit transistor Qu as shown in FIG. 8A has a device isolation trench 2b individually;

FIG. 12B shows IC-VCB characteristics in a case of inserting a ballast resistance to the emitter terminal for each of the unit transistors in a structure where the existent unit transistor Qu as shown in FIG. 8A has a device isolation trench 2b individually;

FIG. 12C shows IC-VCB characteristics in a case of inserting a ballast resistance to the emitter terminal of each unit transistor Qu and, further, applying the embodiment shown in FIG. 10;

DETAILED DESCRIPTION OF THE PREFERRED EMBODIMENTS

The present invention is to be described specifically by way of examples with reference to the drawings. In this embodiment, the bipolar transistor is simply referred to as a transistor.

Embodiment 1

Figure 1A:
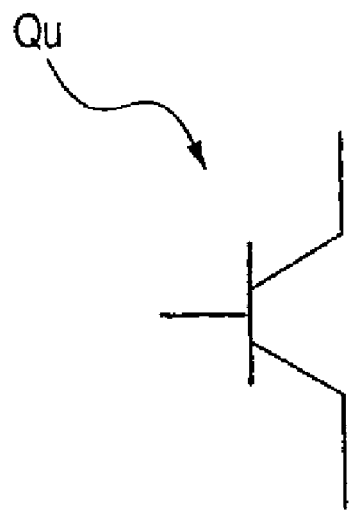
FIG. 1A is a symbol chart for a transistor constituting a semiconductor device as an embodiment according to the present invention.

FIG. 1A shows a unit transistor Qu constituting a semiconductor device applied with the present invention.

Figure 1B:
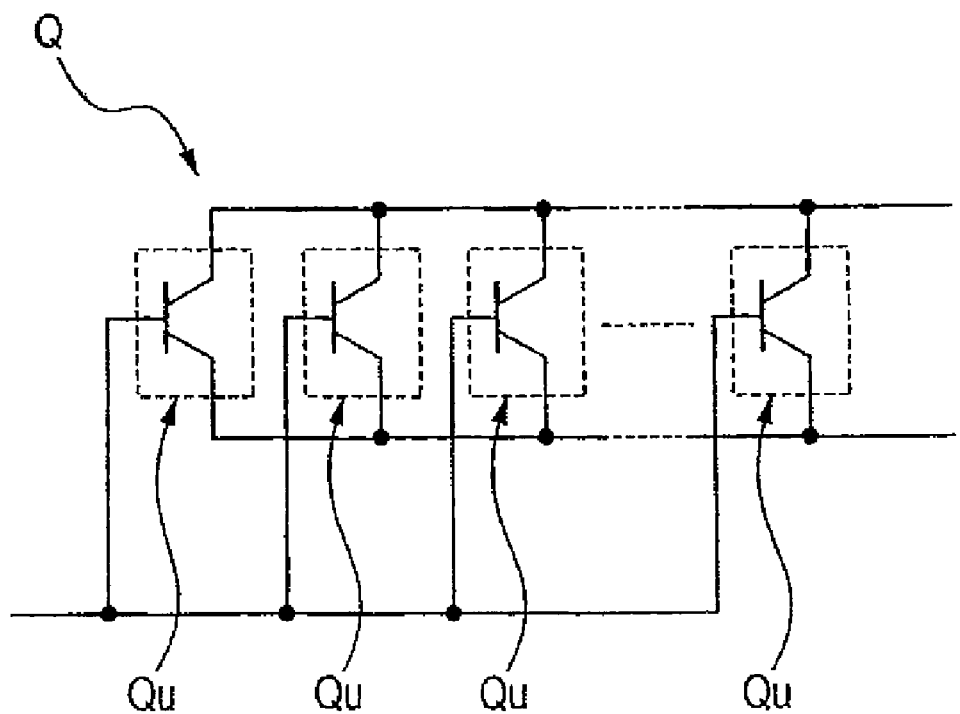
FIG. 1B is a circuit diagram in a case of connecting the transistors in FIG. 1A in parallel.

In FIG. 1B, a transistor Q is formed by connecting a plurality of the unit transistors shown in FIG. 1A in parallel.

Figure 2A:
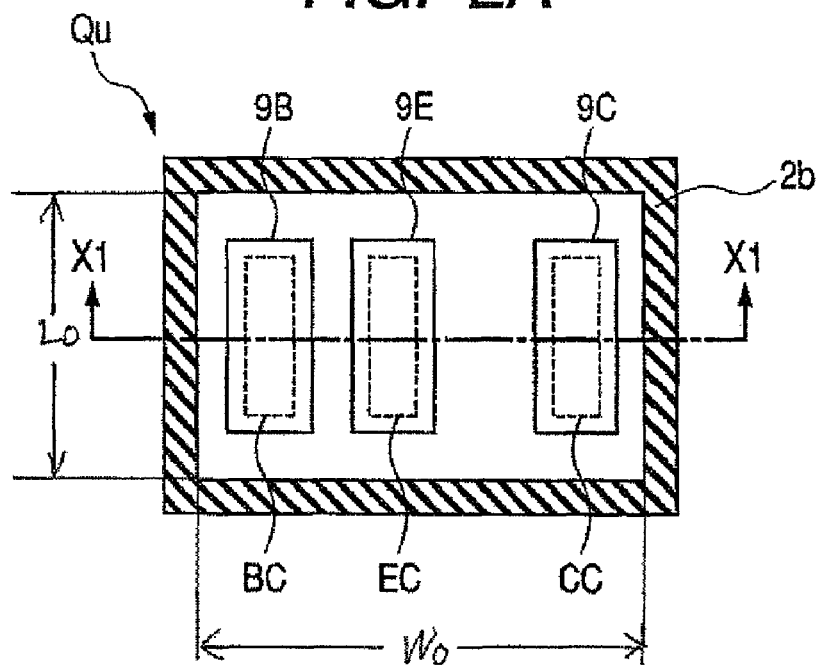
FIG. 2A is a plan view of a unit transistor of the existent structure shown in FIGS. 1A and 1B.
Figure 2B:
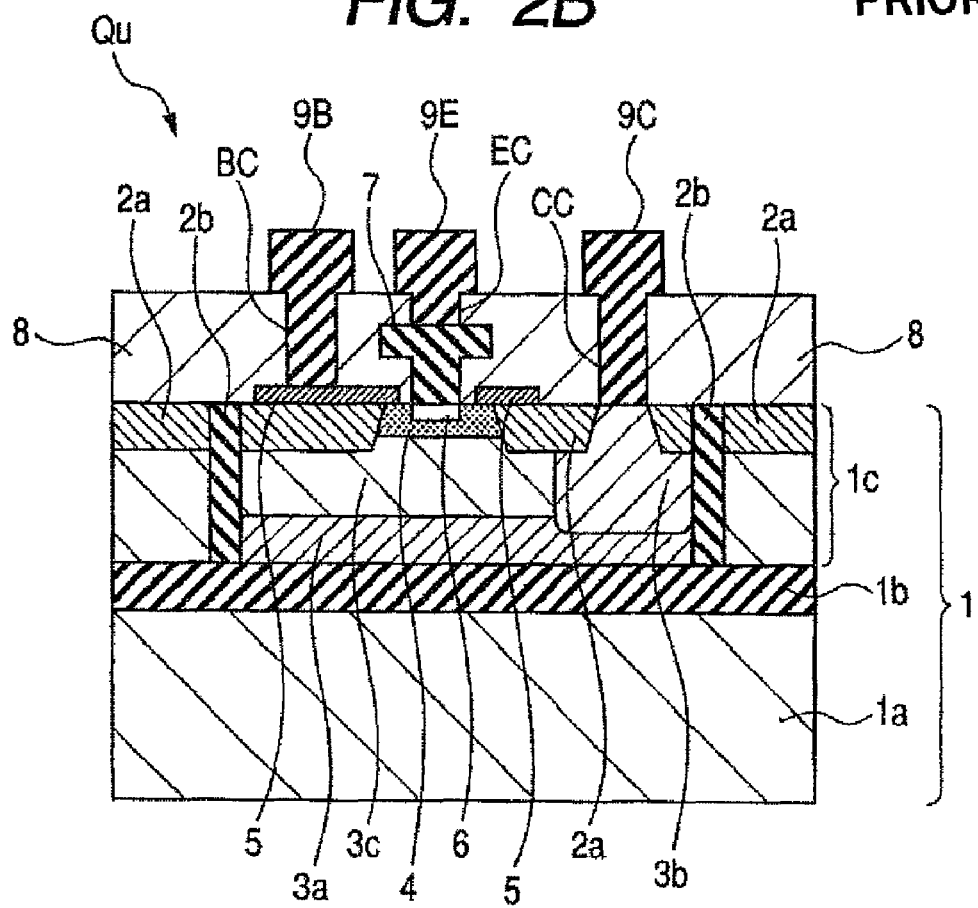
FIG. 2B is a cross sectional view taken along line X1-X1 in FIG. 2A in a case where the unit transistor is an npn type.

FIGS. 2A and 2B show an example of a device structure for a unit transistor Qu in the prior art shown in FIGS. 1A and 1B. FIG. 2A shows a plan view of the unit transistor Qu, and FIG. 2B shows a cross sectional view taken along line X1-X1 in FIG. 2A in a case where the unit transistor Qu is an npn type. While the example of the device structure is an insulated device isolation type transistor using an SOI substrate, the invention is applicable also to an insulated device isolation type transistor using a BULK substrate (the transistor formed region is electrically isolated through a PN-junction from the substrate bulk). Further, the conduction type of the transistor may be either an npn type or a pnp type. Further, the structure of the transistor may be a lateral, longitudinal, or hetero structure with no particular restriction.

The electrodes are arranged, as an example as shown in FIG. 2(a), in line with, from the left, base contact BC, emitter contact EC and collector contact CC. Those electrodes may be arranged in line with emitter contact EC, base contact BC and collector contact CC.

In case of a BICMOS process, in general, there is provided plural design data for 10 to 2o transistors configured each other with different emitter sizes in order to optimize a required circuit design. In case of designing super high speed transistors, typified by SiGeHBT (Heterojunction Bipolar) Transistor, because of a technical difficulty of growing an epitaxial layer of SiGe in uniform in terms of thickness and ingredient distribution, several variations are prepared for emitter sizes Ae in a range from 0.15 μm×0.5 μm to 0.4 μm×20.0 μm.

An electric capacitor parasitic to a transistor against the substrate 1 depends upon a sum of a capacitor parasitic to the isolation trench 2b and a capacitor parasitic to the bottom collector region 3a against the lower substrate layer 1a. In another word the electric capacitor parasitic to the transistor depends upon the size of the internal area within the isolation trench 2b. In order to suppress increase of such parasitic capacitors unnecessarily, a distance of end portions of an emitter contact EC and a collector contact CC from the nearest isolation trench 2b is formed of the same size for the various transistor designs even if emitters of such transistors are configured to have different sizes.

In FIGS. 2A and 2B, and subsequent figures, it is noted that numeral 1 identifies an SOI substrate comprised, for example, of a 40 Ωcm-resistivity P-type silicon lower substrate layer 1a of 800 μm thickness, and a 0.5 μm-thick insulative layer 1b of SiO2 and a thin semiconductor layer 1c of a 10 Ωcm-resistivity N-type silicon layer of 1.8 um thickness, which includes a semiconductor device forming area. In addition, areas forming the collector, base and emitter of the devices, the device forming area includes insulative layers 2a and 2b of SiO2. In particular, the area 2b is a device isolation trench.

As illustrated in FIGS. 2A and 2B, and subsequent figures, for example, the emitter, base and collector regions are formed with an N-type emitter region 6, a P-type base region 4 of 8 nm, a 3 Ωcm-resistivity N-type epitaxial collector layers of 0.3 μm and N-type collector regions 3a, 3b and 3c. The buried collector region 3a is formed by doping Sb at energy of 100 KeV with 2.0E15/cm.

A base contact BC is formed with a base electrode 9B contacting a contact layer 5 which connects the electrode 9b with the base region 4. A collector contact region CC is formed with the electrode 9C coming into contact with the collector region 3b. The emitter contact EC is formed with the emitter electrode 9E and the underlying emitter contact area 7.

Figure 3A:
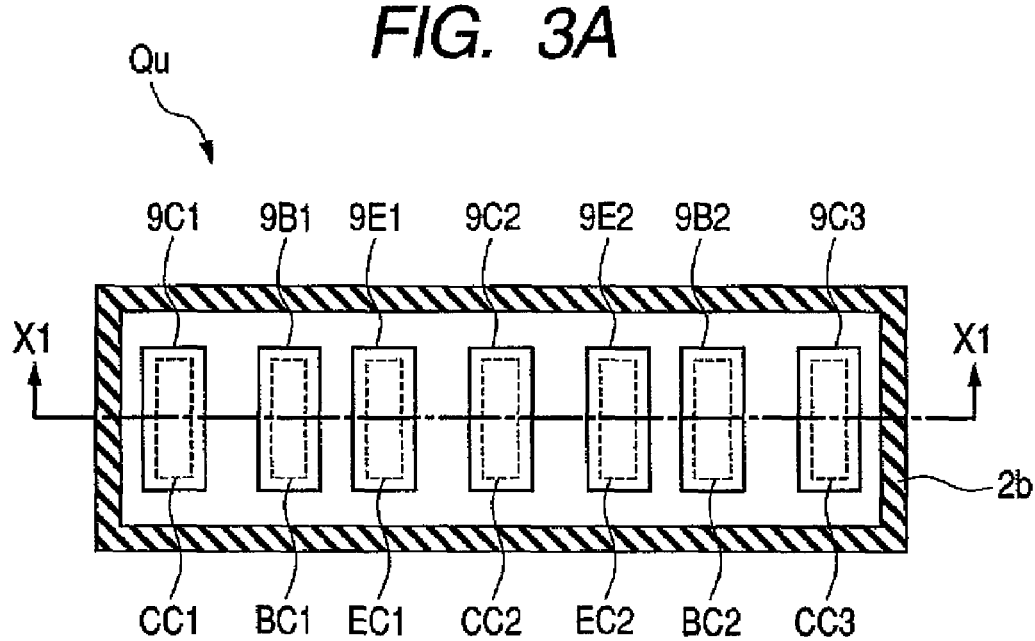
FIG. 3A is a plan view of a unit transistor of a multi-emitter type of the existent structure shown in FIGS. 1A and 1B.
Figure 3B:
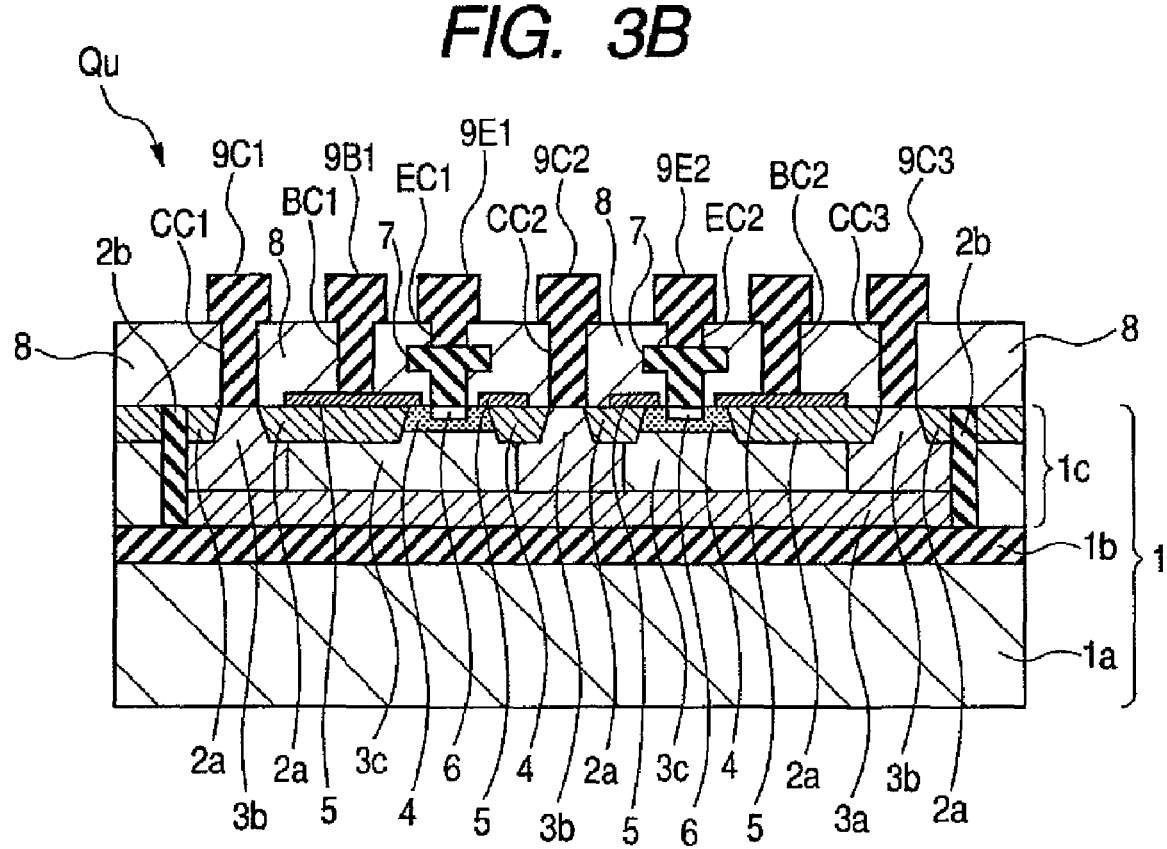
FIG. 3B is a cross sectional view taken along line X1-X1 in FIG. 3A in a case where the unit transistor is an npn type.

FIGS. 3A and 3B show an example of a device structure in which the unit transistor Qu in the prior art shown in FIG. 1 is a multi emitter type. FIG. 3A is a plan view for the unit transistor Qu, FIG. 3B shows a cross sectional view taken along line X1-X1 in FIG. 3A in a case where the unit transistor Q is an npn type. The size between two emitters EC1-EC2 and the size between emitter-device isolation trenches 2b is designed as a minimum layout size in the process, or a size approximate to the minimum layout size in order to enhance the performance and increasing the integration degree of the device.

Since the unit transistor Qu is surrounded with a device isolation trench 2b of high heat resistance for electrical isolation from adjacent devices, structure has poor heat dissipation and high thermal resistance.

Figure 4A:
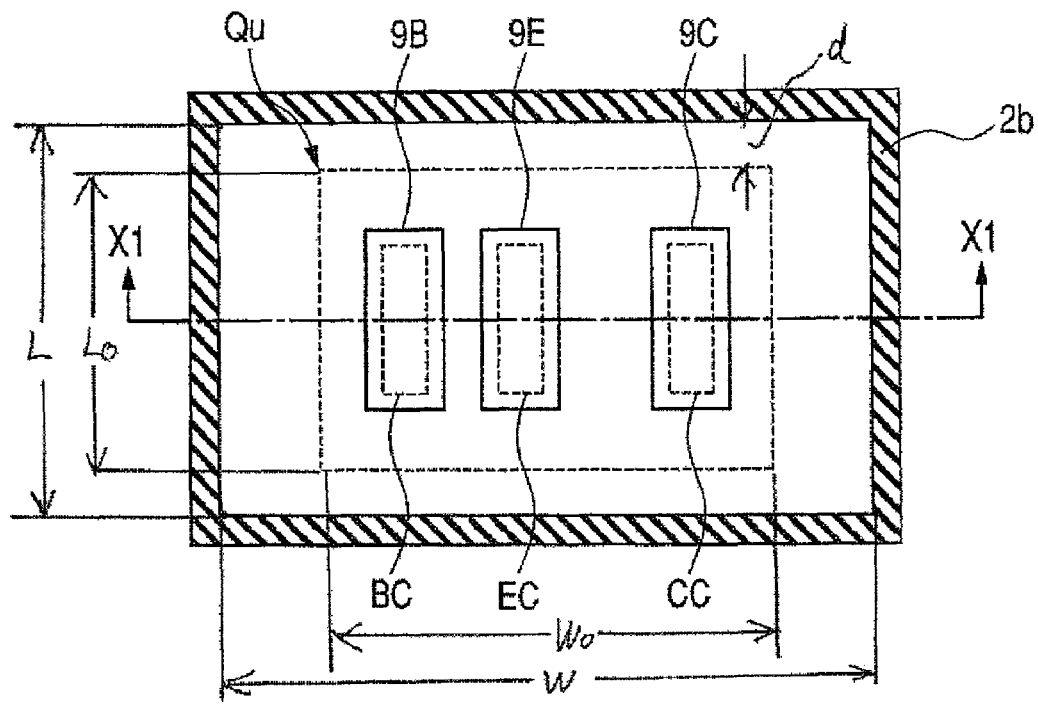
FIG. 4A is a plan view of a unit transistor as an embodiment of the invention.

FIG. 4A shows an example for the unit transistor Qu formed on an SOI substrate 1 with the emitter 6 having the same size as in the transistor shown in FIGS. 2A and 2B. The unit transistor Qu may also be incorporated in a multi-emitter structure as shown in FIGS. 3A and 3B.

Figure 4B:
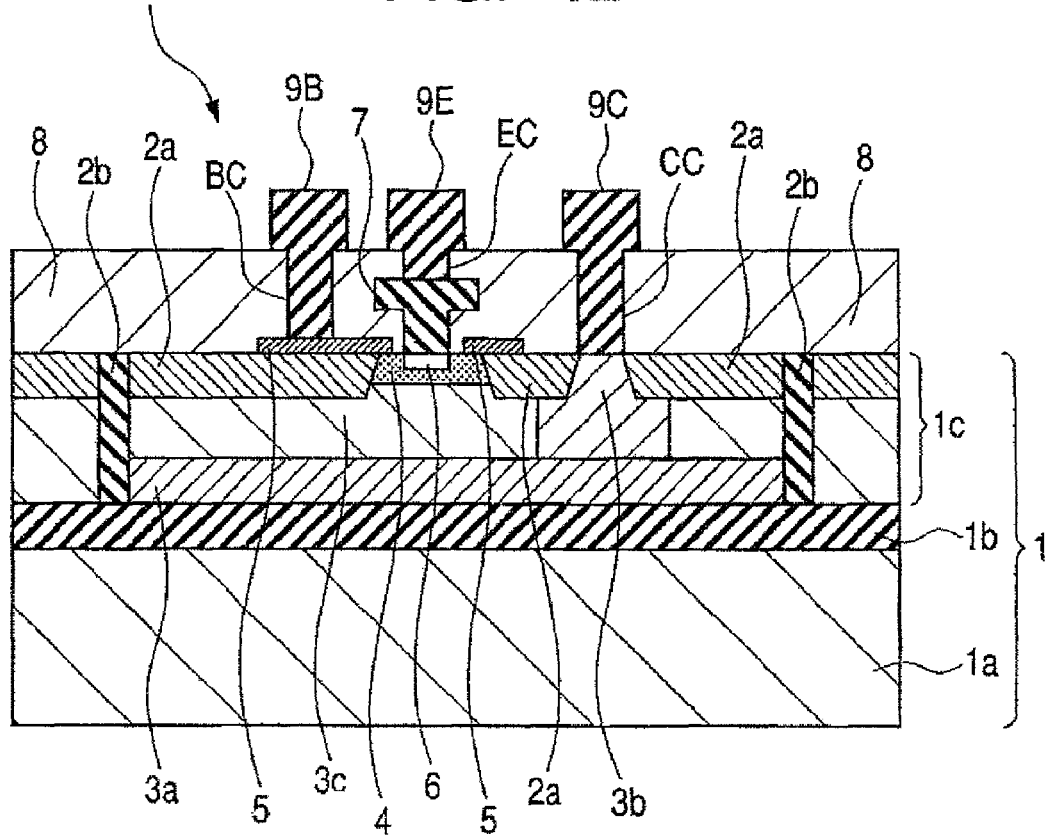
FIG. 4B is a cross sectional view along line X1-X1 in FIG. 4A in a case where the unit transistor is an npn type.

In FIG. 4A the area surrounded by a broken line shows an active region which operates effectively as the transistor Qu according to this invention in which the transistor Qu may be of an npn type as shown in FIG. 4B as an example. The area surrounded by the broken line, which is the active area working effectively as the transistor according to this invention, corresponds to the area surrounded by the isolation trench 2b shown in FIGS. 2A and 2B, in which the active area working as the transistor Qu contacts the isolation trench 2b in the prior art transistor structure.

Differently from the prior art configuration of the transistor Qu, the active area of the transistor Qu is configured to have a distance or a space of at least 1 μm between the active area of the transistor Qu and the isolation trench 2b whereby the internal area surrounded by the isolation trench 2b in FIGS. 4a and 4B according to this invention is enlarged as compared with that in FIGS. 2A and 2B of the prior art.

FIG. 4B show a section at X1-X1, as an example, of the npn unit transistor Qu, in which the end of the buried collector region 3a is extended and spaced by distance d from the emitter EC as compared with that as shown in FIGS. 2A and 2B. Namely the active region Qu is spaced by distance d from the isolation trench 2b in the transistor structure as shown in FIG. 4. The buried collector region 3a may be formed by implantation of an N-type impurity into the semiconductor layer 1C.

Since radiation of the heat generated by the transistor Qu is shielded or blocked by the insulative layer 1b of the SOI substrate and the device isolation trench 2b both of high thermal resistance, the thermal resistance Rth of the unit transistor Qu depends on the inside area surrounded by the device isolation trench 2b. Accordingly, such expansion of the inside area surrounded by the device isolation trench 2b as shown in FIGS. 4A and 4B according to this invention effectively decreases the thermal resistance of the unit transistor Qu as compared with the prior art transistor structure as shown in FIGS. 2A and 2B.

FIG. 5A to FIG. 5D show various results of measurement for the unit transistor in a case of the example in FIGS. 4A and 4B. What is shown by device isolation trench standard in the graph is for the prior art transistor structure shown in FIGS. 2A and 2B and other data is for the unit transistor according to this invention as the example shown in FIGS. 4A and 4B.

Figure 5A:
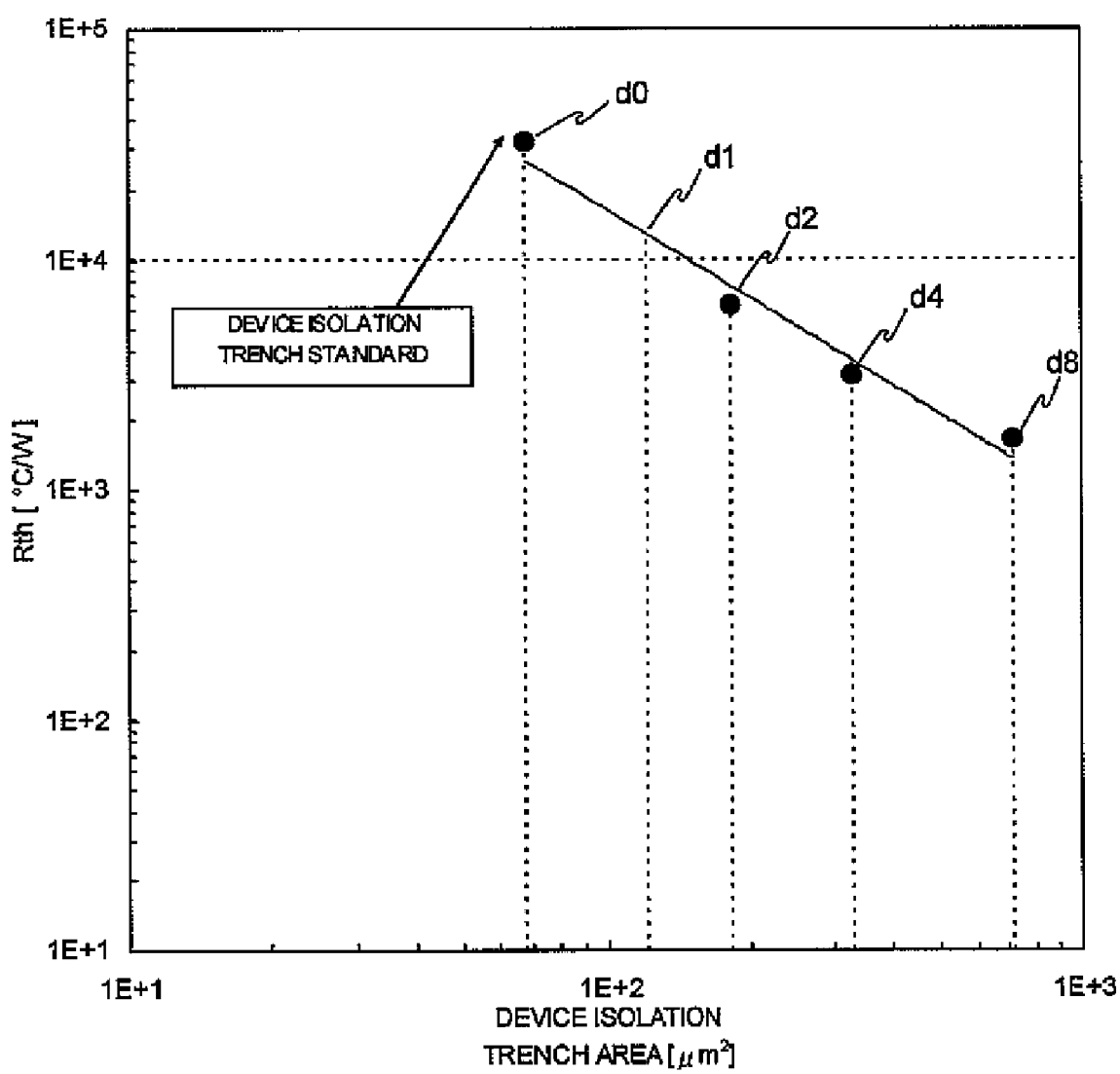

FIG. 5A shows the dependence of the thermal resistance Rth of the unit transistor on the device isolation trench area (area insides the device isolation trench 2b). The transistor structure shown in FIGS. 2A and 2B provided for the measurement is configured to have the device isolation trench area sized L0 (21.45 µm)×W0(3.175 µm)=68.104 µm², the thermal resistance of which was measured as 31,900° C./W, which corresponds to d0 on FIG. 5A.

According to this invention, the transistor structures shown in FIGS. 4A and 4B provided for the measurements are configured to have (1) the distance d between the isolation trench 2b and the active region (Qu) sized 2 µm and the device isolation trench area sized L (25.45 µm)×W(7.175 µm)=182.604 µm², the thermal resistance of which was measured as 6,230° C./W, which corresponds to d2 on FIG. 5A; (2) the distance d sized 4 µm and the device isolation trench area sized L (29.45 µm)×W(11.175 µm)=329.104 µm², the thermal resistance of which was measured as 3,110° C./W, which corresponds to d4; and (3) the distance d sized 8 µm and the device isolation trench area sized L (37.45 µm)×W (19.175 µm)=718.10 µm², the thermal resistance of which was measured as 1,640° C./W, which corresponds to d8, respectively.

The line plotted along the measured points d0, d2, d4 and d8 as shown in FIG. 5A can be approximated by:

$$Rth = 5.640E+06 X^{-1.267E+00}$$ (equation 1), wherein X stands for the size of the device isolation trench area. Using this equation the thermal resistance for the transistor structure shown in FIGS. 4A and 4B configured to have the distance d1 sized 1 µm {the device isolation trench area sized L (23.45 µm)×W(5.175 µm)=121.354 µm²} is interpolated as 12,900° C./W, which shows about 40% decreased as compared to that of the transistor structure configured with d=0 shown in FIG. 2.

As explained above, the larger the area surrounded by the device isolation trench is enlarged, the further the thermal resistance is decreased by providing a space area SA between the device isolation trench and the active region of the transistor Qu. That shows the thermal resistance Rth lowers alone with enlargement of the device isolation trench 2b and the heat dissipation is improved.

Such space areas can be calculated by L×W−L0×W0:

For $d = d1$: $SA = L(23.45\ \mu m) \times W(5.175\ \mu m) -$
$L0(21.45\ \mu m) \times W0(3.175\ \mu m)$
$= 121.354\ \mu m^2 - 68.104\ \mu m^2$
$= 53.25\ \mu m^2$;

For $d = d2$: $SA = L(25.45\ \mu m) \times W(7.175\ \mu m) -$
$L0(21.45\ \mu m) \times W0(3.175\ \mu m)$
$= 182.60\ \mu m^2 - 68.104\ \mu m^2$
$= 114.50\ \mu m^2$;

For $d = d4$: $SA = L(29.45\ \mu m) \times W(11.175\ \mu m) -$
$L0(21.45\ \mu m) \times W0(3.175\ \mu m)$
$= 329.10\ \mu m^2 - 68.104\ \mu m^2$
$= 261.00\ \mu m^2$; and For $d = d8$: $SA = L(37.45\ \mu m) \times W(19.175\ \mu m) -$
$L0(21.45\ \mu m) \times W0(3.175\ \mu m)$
$= 718.10\ \mu m^2 - 68.104\ \mu m^2$
$= 650.00\ \mu m^2$.

Figure 5B:
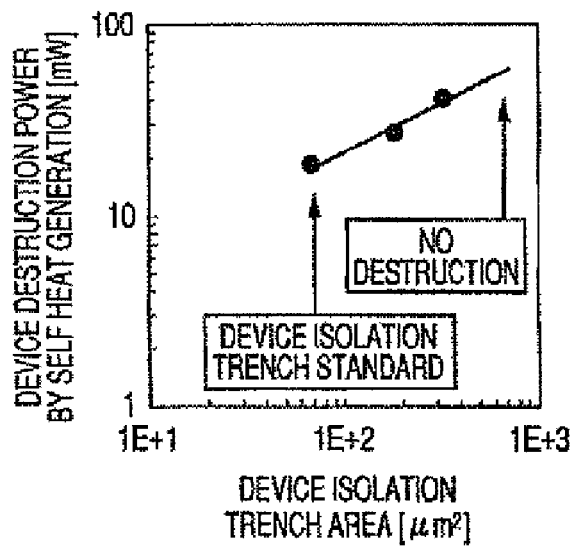

FIG. 5B shows the dependence of the device destruction power by the self-heating effect of the unit transistor on the device isolation trench area. It is possible to increase the power that causes destruction of the device by the lowering of the thermal resistance of the unit transistor by the enlargement of the device isolation trench 2b. In the example, device destruction was not observed when the trench was enlarged by 8 µm each in the direction of the row and direction of the column relative to the device isolation trench 2b from the active region of the unit transistor which corresponds to the prior art structure shown in FIGS. 2A and 2B.

Figure 5C:
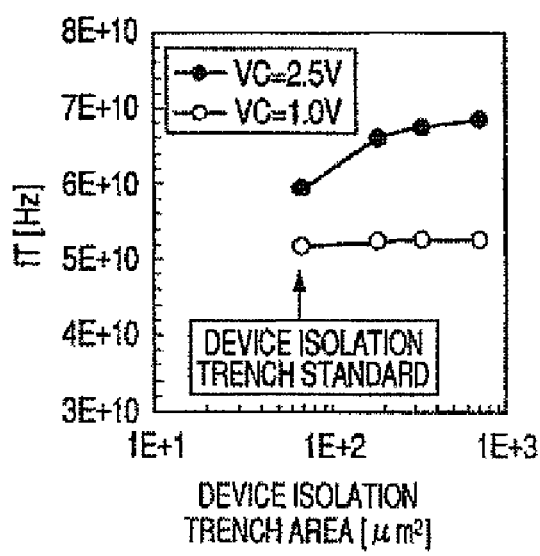

FIG. 5C shows the dependence of the current gain cut-off frequency fT on the device isolation trench area. Along with the enlargement of the device isolation trench area, the current gain cut-off frequency fT at high VCE is also improved.

Figure 5D:
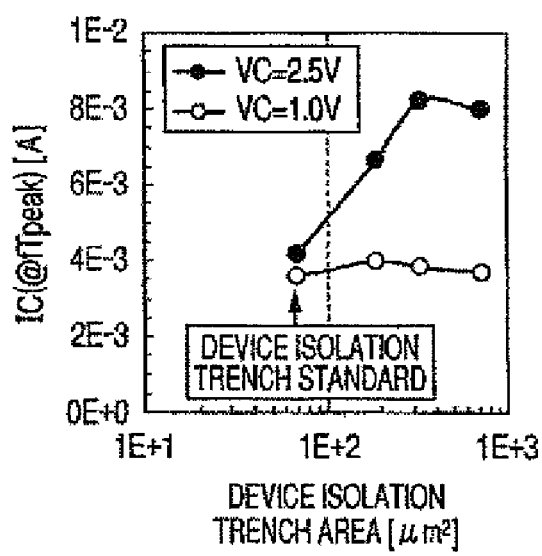

FIG. 5D shows the dependence of the collector current (IC@fTpeak) upon maximum current gain cut-off frequency (fTpeak) on the device isolation trench area. It was confirmed that IC@fTpeak was also improved along with enlargement of the device isolation trench area.

Figure 6:
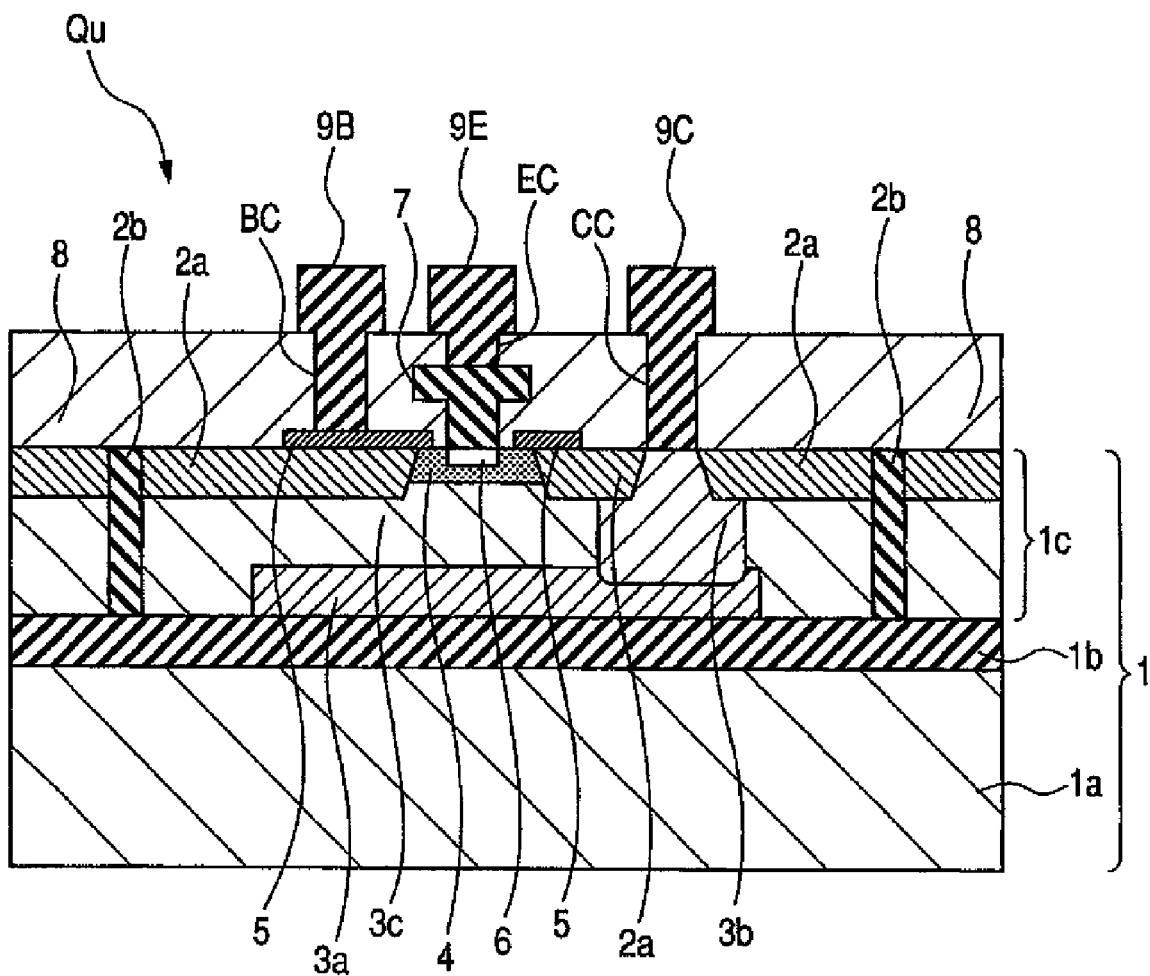
FIG. 6 is a cross sectional view taken along line X1-X1 of another embodiment shown in FIG. 4A.

FIG. 6 shows a section at X1-X1 of another example in the unit transistor shown in FIG. 4A. This is a structure in which the buried collector region 3a is formed only in the region corresponding to the active transistor region Qu surrounded by the broken line as shown in FIG. 4A. Since the area of the buried collector region 3a is smaller as compared with the transistor structure shown in FIG. 4B, the bottom component of the capacitance relative to the substrate can be decreased.

Figure 7:
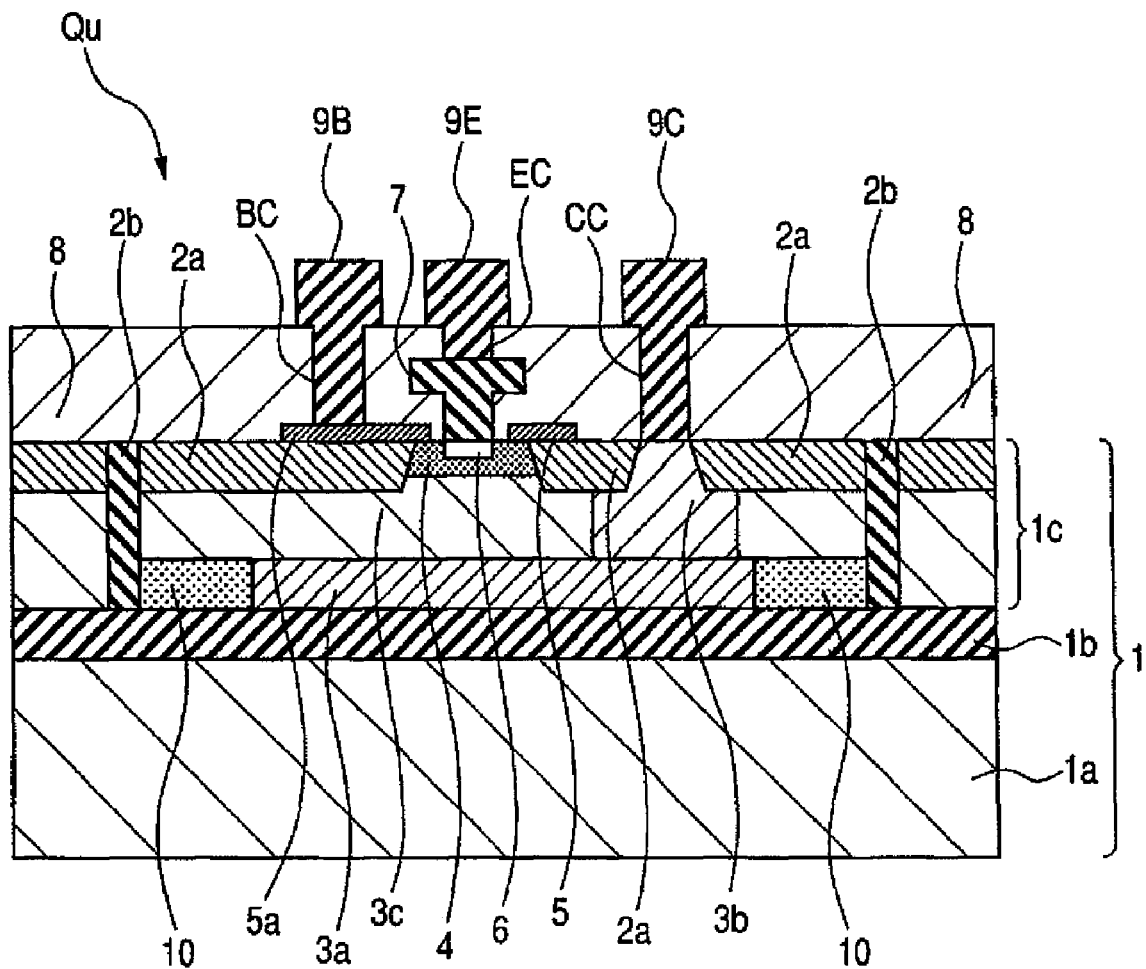
FIG. 7 is a cross sectional view taken along line X1-X1 of as a further embodiment shown in FIG. 4A.

FIG. 7 shows other example in the unit transistor shown in FIG. 6. This is a structure in which a depletion region with a low concentration layer 10 is formed between the buried collector region 3a and the device isolation trench 2a. In the structure shown in FIG. 4B, the peripheral component of the capacitance relative to the substrate is determined only with the capacitance of the device isolation trench 2b, whereas this is determined by a serial capacitance of the capacitance of the device isolation trench 2b and the capacitance of the depletion region with the low concentration layer 10 in the structure of FIG. 7. Further, also for the bottom component of the capacitance relative to the substrate, it is determined by a serial capacitance of the capacitance for the depletion region with the low concentration layer 10 and the capacitance for the insulative layer 1b of the SOI substrate 1 at the end of the buried collector region 3a. Accordingly, this is a structure capable of further decreasing the capacitance relative to the substrate compared with the structure of FIG. 6.

Embodiment 2

Figure 8A:
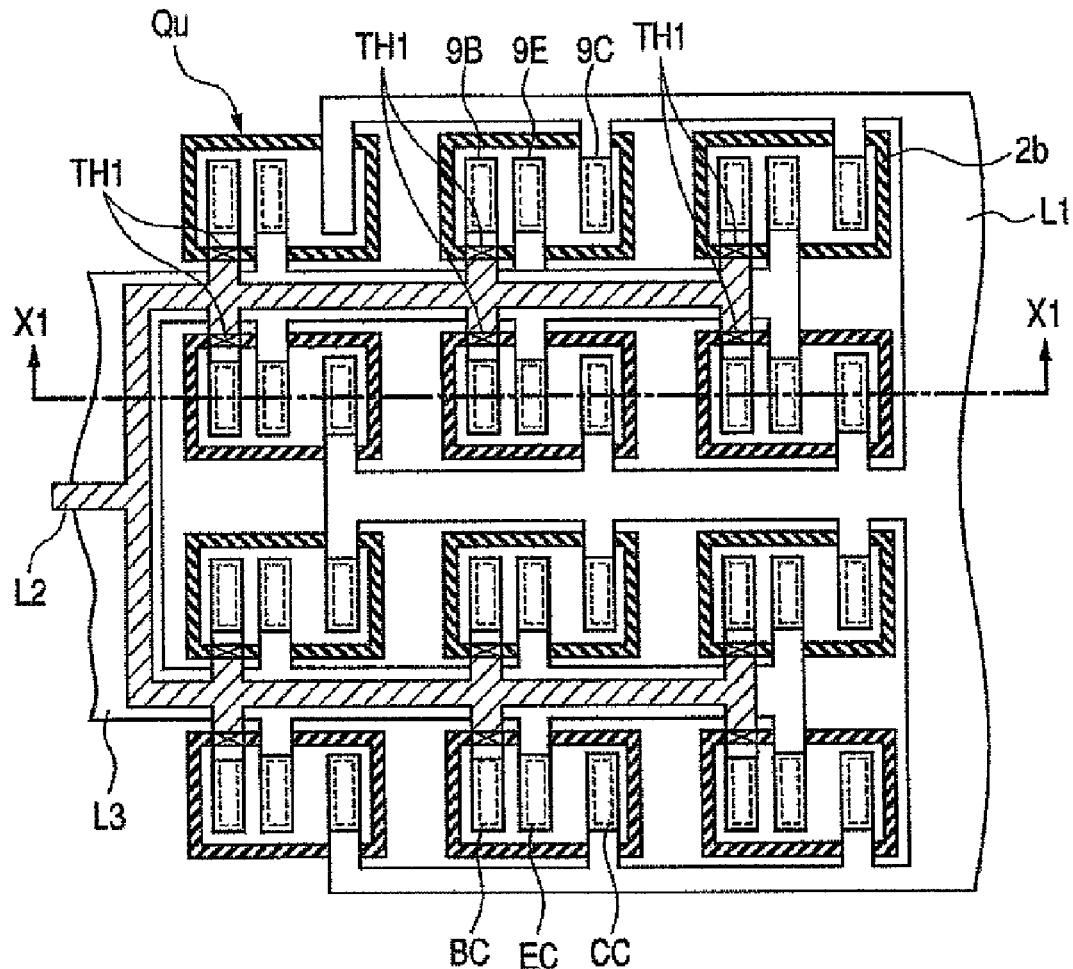
FIG. 8A is a plan view in a case of connecting in parallel a plurality of unit transistors of the existent structure shown in FIGS. 1A and 1B.
Figure 8B:
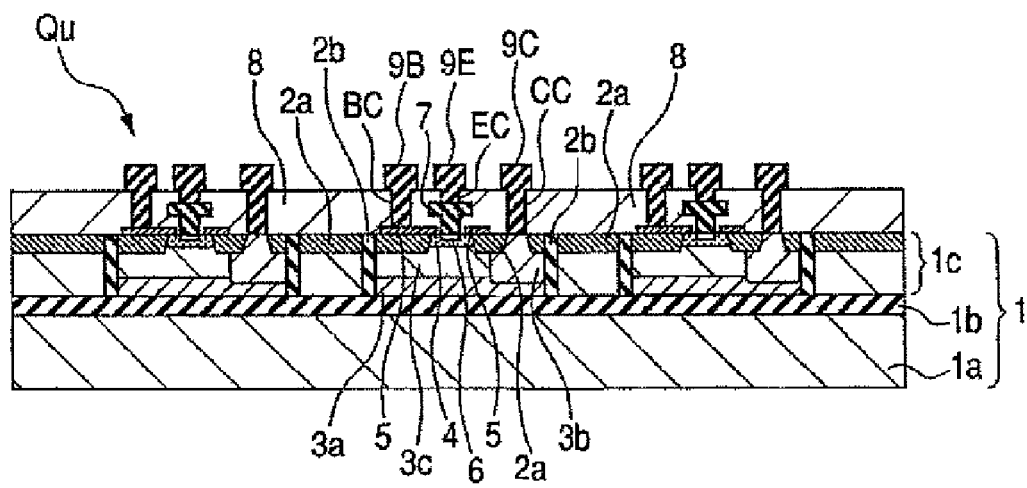
FIG. 8B is a cross sectional view taken along line X1-X1 in FIG. 8A in a case where the unit transistor is an npn type.

FIGS. 8A and 8B show an example of a device structure in a case of connecting in parallel a plurality of the unit transistors Qu in the prior art shown in FIGS. 2A and 2B. FIG. 8A is a plan view in a case of connecting in parallel a plurality of the unit transistors Qu and FIG. 8B is a cross sectional view taken alone line X1-X1 in FIG. 8A in a case where the unit transistor Qu is an npn type.

Figure 9A:
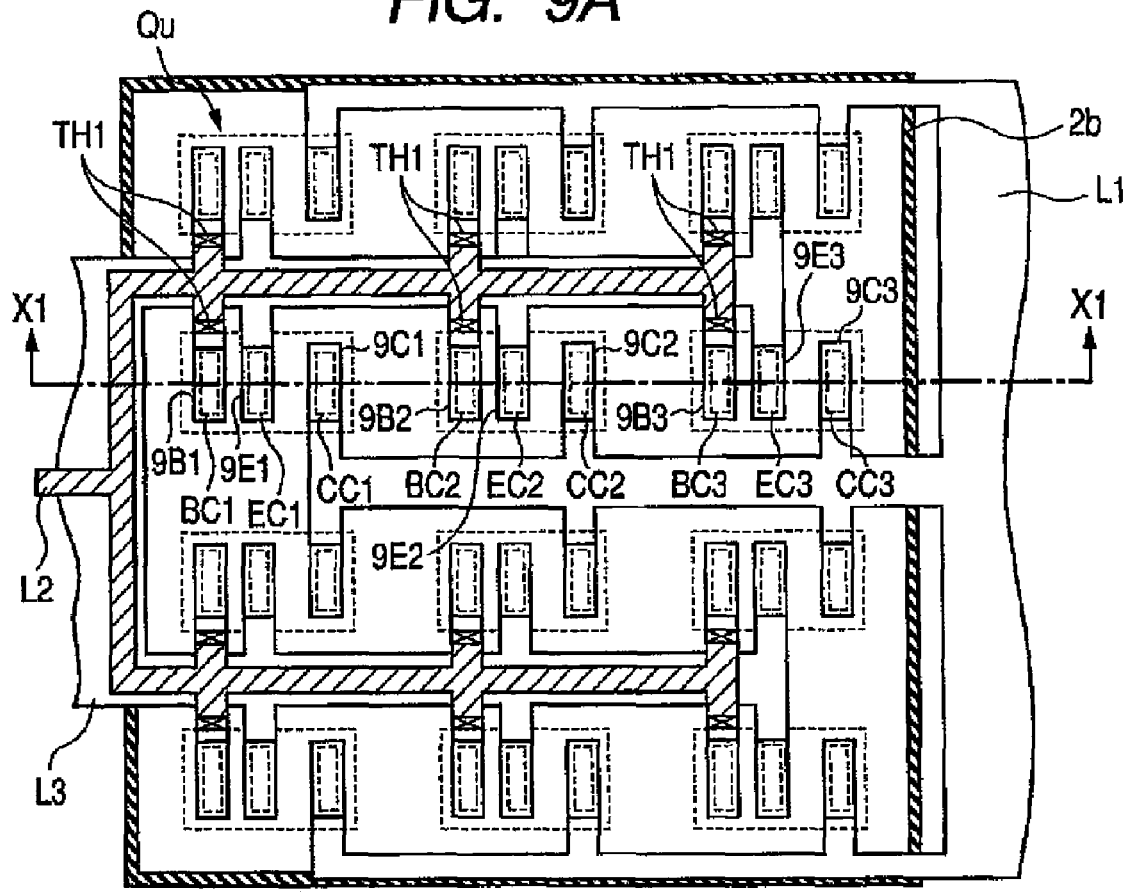
Figure 9B:
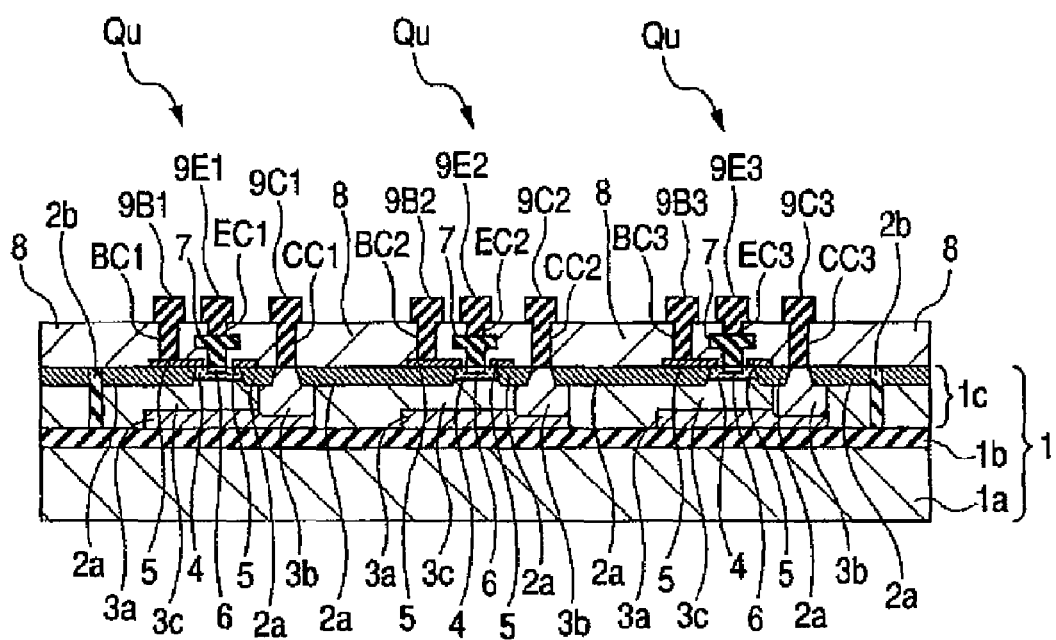

FIGS. 9A and 9B show an example according to this invention in a case of connecting in parallel a plurality of the unit transistors Qu in parallel. The unit transistor may also be a multi-emitter structure as shown in FIGS. 3A and 3B. FIG. 9A and FIG. 9B show an example of removing the device isolation trench 2b for each of the unit transistors Qu and entirely surrounding the plurality of unit transistors Qu connected in parallel with one device isolation trench 2b.

While the cross sectional structure is similar with that of the multi-emitter type unit transistor Qu shown in FIGS. 3A and 3B, the unit transistor Qu in FIGS. 3A and 3B for enhancing the performance and increasing the integration degree of the device, is designed to a minimum layout size or a size approximate to the minimum layout size in the process. On the other hand, the example of FIGS. 9A and 9B has a structure in which the size between emitters (EC1, EC2, EC3) of each of the unit transistors Qu, and the size between the emitter of the unit transistor Qu disposed to the outer most periphery and the device isolation trench 2b is much wider in order to improve the heat dissipation.

In this embodiment, since the inter-emitter distance between adjacent unit transistors Qu is spaced apart further and the distance between the emitter of the unit transistor Qu deposed to the outermost periphery and the device isolation trench is enlarged, this provides a structure capable of lowering the thermal resistance Rth of the unit transistor Qu compared with the existent structure shown in FIGS. 8A and 8B. Further, since the plurality of unit transistors Qu are surrounded with one device isolation trench 2b, this provides a structure capable of decreasing the scattering of the thermal resistance Rth between each of the unit transistors Qu. Further, since the device isolation trench 2b disposed to each of the unit transistors Qu individually is removed, the peripheral component of the capacitance relative to the substrate which was determined by the device isolation trench 2b between adjacent unit transistors Qu is eliminated, so that the capacitance relative to the substrate can be decreased compared with that in FIGS. 8A and 8B.

Figure 10:
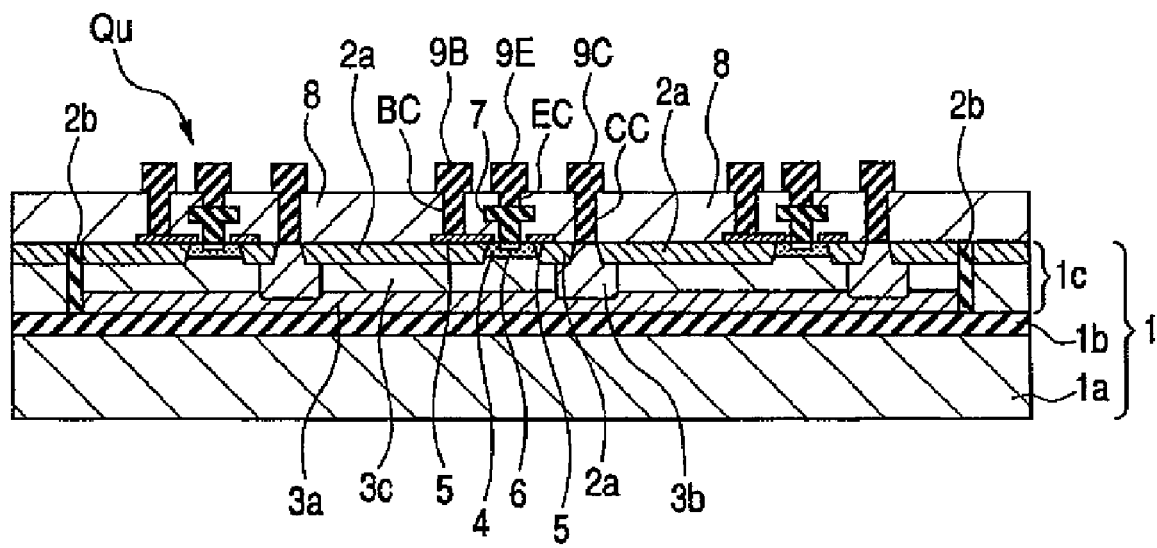
FIG. 10 is a cross sectional view taken along line X1-X1 of another embodiment of FIG. 9A.

FIGS. 10A and 10B show other embodiment in a case of connecting in parallel a plurality of unit transistors Qu shown in FIGS. 9A and 9B. This is a structure in which the buried collector region 3a is buried over the entire inside of the device isolation trench 2b. Since the buried collector regions 3a of the respective unit transistors Qu are in contact with each other, this provides a structure capable of decreasing the scattering of the thermal resistance Rth between each of the unit transistors Qu. Like the structure shown in FIGS. 9A and 9B, the peripheral component of the capacitance relative to the substrate can be decreased and, in this embodiment, the capacitance relative to the substrate for the entire transistors connected in parallel in plurality was decreased by about 25% compared with that of the existent structure shown in FIGS. 8A and 8B.

Figure 11:
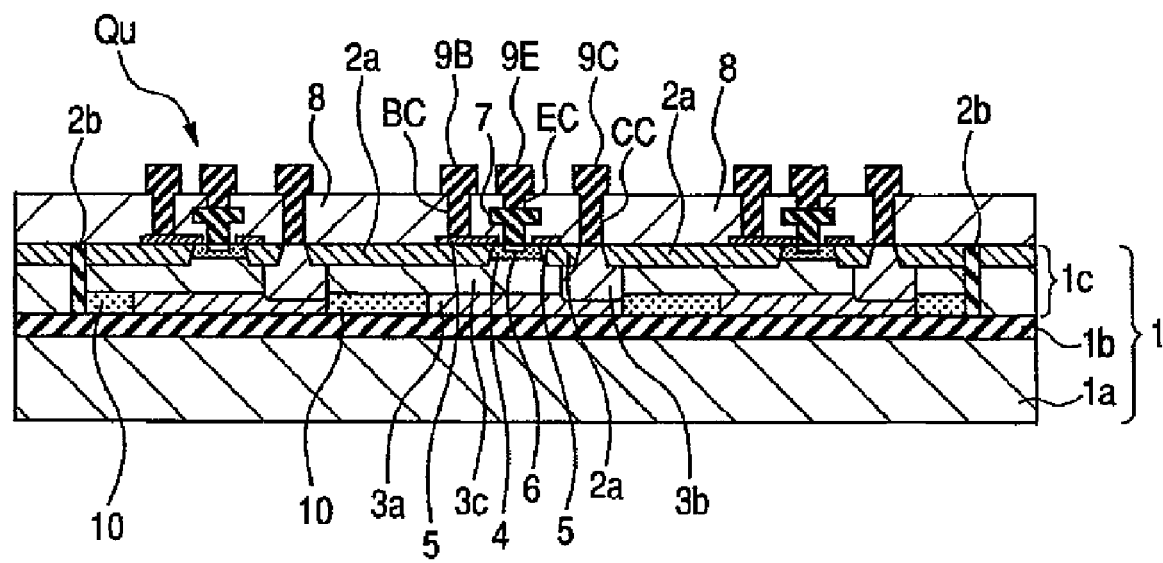
FIG. 11 is a cross sectional view taken along line X1-X1 of another embodiment of FIG. 9A.

FIG. 11 shows other embodiment in a case of connecting in parallel a plurality of unit transistors Qu shown in FIGS. 9A and 9B. This is a structure in which a depletion region with a low concentration layer 10 is formed between the buried collector regions 3a of each of the unit transistors Qu and between the buried collector region 3a of the unit transistor Qu arranged at the outer most circumference and the device isolation trench 2b.

Since the peripheral component of the capacitance of each unit transistor Qu relative to the substrate is determined by the serial capacitance of the capacitance for the depletion region with the low concentration layer 10 and the capacitance for the insulated layer 1b of the SOI substrate 1, this provides a structure capable of further decreasing the capacitance relative to the substrate compared with that in FIGS. 9A and 9B and FIGS. 10A and 10B.

Figure 12A:
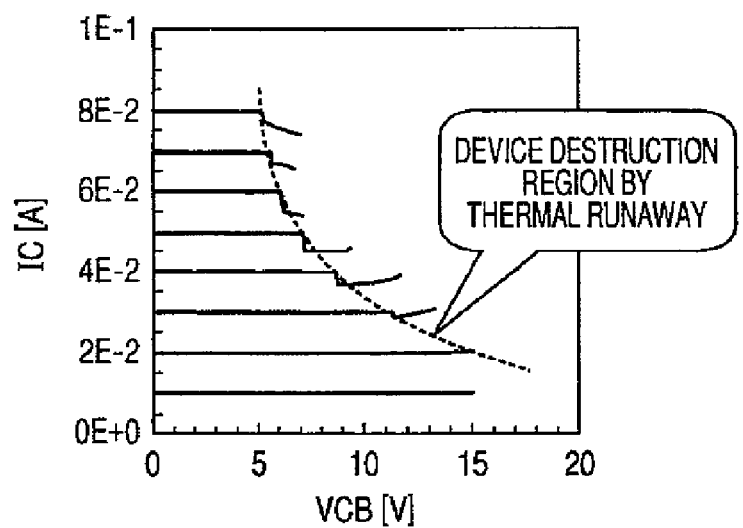
Figure 12B:
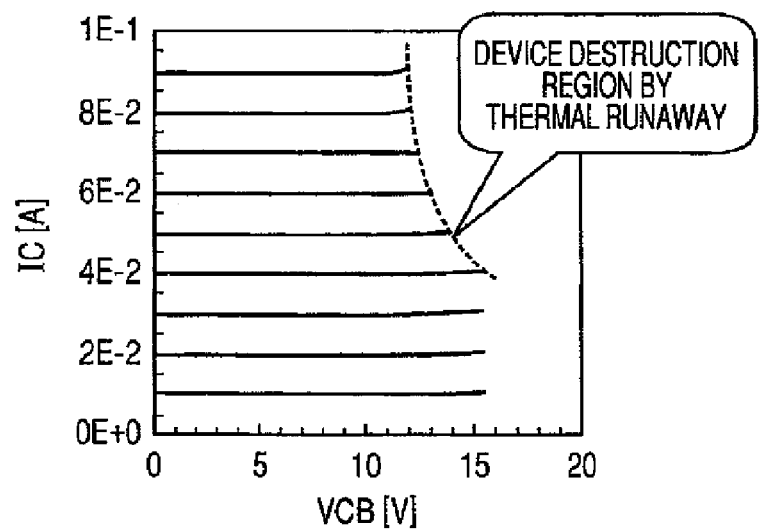
Figure 12C:
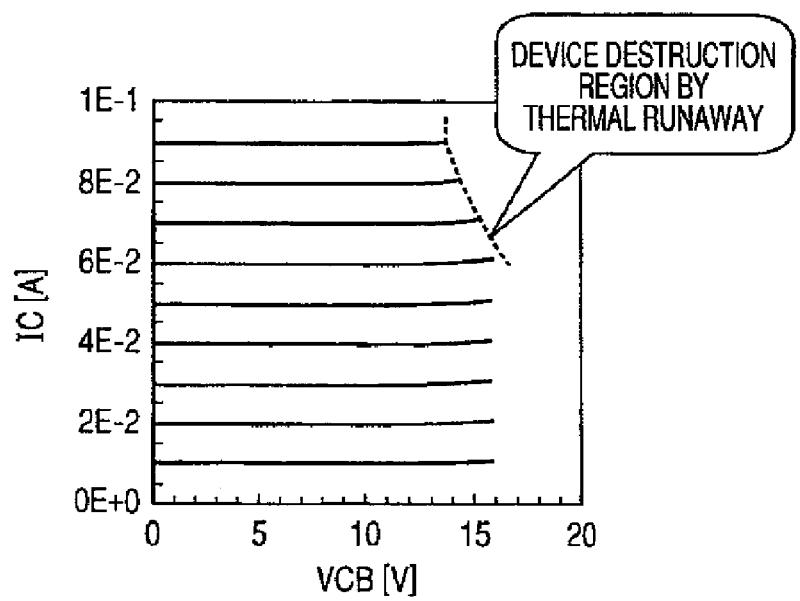

FIGS. 12A to 12C show the result for measurement of IC-VCB characteristics in a case of an output buffer configured by connecting in parallel a plurality of base-ground unit transistors Qu used at 2 mA/emitter. The transistors are arranged by the number of five in the direction of the column and by the number of eight in the direction of row, and the unit transistors Q are connected in parallel by the number of 40 in total.

FIG. 12A shows the IC-VCB characteristics in a case where the unit transistors Qu, each with the transistor structure as shown in FIGS. 3A and 3B, are connected in parallel as shown in FIG. 8A and each of the unit transistors Qu has the device isolation trench 2b individually. There exist differences among parasitic resistances existing along the emitter interconnection of each of the unit transistors Qu. A thermal runaway may occur, under the self-heating effect, at one or more of the unit transistors Qu arranged to a portion of the emitter interconnection at which the parasitic resistance is relatively lower. Such the self-heating effect may cause destruction of the transistor when such transistor is being used in a region above the broken line shown in FIG. 12A. In order to prevent such destruction of the transistors, a design rule is provided for the transistors to be used in the region below the broken line.

In an emitter-ground amplifier having a load configured by a usual resistor, output voltage Vo is determined as a value of power source voltage Vcc subtracted by a voltage drop caused by the resistive load, and a voltage is high between the collector and emitter when the transistor is OFF and a voltage is low between the collector and emitter when the transistor is OFF. That is, an emitter-ground amplifier does not occur to operate above the broken line shown in FIG. 12A by its nature of operation. Accordingly it does not need to set a design rule of the transistor to restrict its operation with respect to the broken line shown in FIG. 12A for an emitter-ground amplifier having a resistive load. In a push-pull circuit which is commonly used as an output circuit wherein electric currents are made ON and OFF while a power source voltage is kept applied to the transistor it is needed to set a design rule of the transistor to operate below the broken line shown in FIG. 12A. Such restriction to operation of the transistor causes a problem that an electric current allowed to supply is restricted at most to IC=20 mA which is far from reaching the aimed performance: IC=40 mA (@VCB=14 V).

FIG. 12B shows an IC-VCB characteristic in a structure in which each of the prior art unit transistors Qu shown in FIGS. 3A and 3B, are connected in parallel as shown in FIGS. 8A and 8B and each unit transistor Qu individually has a device isolation trench 2b, and wherein a ballast resistor is inserted to the emitter terminal of each unit transistor Qu used generally for decreasing differences among the base-emitter voltages VBE on the respective unit transistors Qu.

As shown by the broken line in FIG. 12B, the device breakdown voltage caused by the thermal runaway is improved remarkably compared with the characteristic shown in FIG. 12A. However, it is yet to satisfy the aimed performance because of the thermal runaway caused by the self-heating effect due to variations of the thermal resistances Rth among the unit transistors Qu.

FIG. 12C shows the IC-VCB characteristic in a case of inserting the ballast resistor to the emitter terminal for each of the unit transistors Qu, each with the transistor structure as shown in FIGS. 4A and 4B, are connected in parallel as shown in FIGS. 9A and 9B. This is an embodiment of attaining the aimed performance by decreasing variations of the thermal resistances among the unit transistors with the structure in which the transistors connected in parallel are entirely surrounded with one device isolation trench 2b whereby tolerance against a thermal destruction of the transistor is further improved as compared to one shown in FIG. 12B.

On designing a circuit for semiconductor integrated circuits, in general, are provided various designs rules including a maximum supply voltage, a maximum current, and a maximum consumption power to the transistors in their operation environments in order to prevent the transistors from breakdown. For example, the maximum consumption power Pmax is defined as:

$$P_{max}{}^\alpha = \Delta T_j / R_{th} \quad \text{(equation 2)},$$

Wherein $\Delta T_j$ is a difference of temperatures increasing on the circuit element with respect to an environment temperature caused by the self-heating effect by the circuit element, and Rth is a thermal resistance.

When the distance d of the device isolation trench 2b from the transistor active area Qu as shown in FIG. 5A is designed as 1 μm, the thermal resistance Rth can be decreased by 40% as compared to the case as shown in FIG. 2A, as explained hereinabove with reference to FIG. 5A. Accordingly, the maximum consumption power for the transistor structure of d=1 μm is estimated as $P_{max}{}^\alpha = \Delta T_j / (R_{th} \times 0.4)$. Then the collector current IC is estimated as 50 mA (20 mA×2.5) at VCB=15V as shown in FIG. 12C, which clears the target IC of 40 mA.

It is known according to a heat analysis that heat generated at a center portion of the transistor Qu is larger than that at its peripheral portion. Distances from the central portion of the transistor, at which heat is generated, to expansion of the wall of the device isolation trench 2b which hinders radiation of hear, are relatively uniform in case of the transistor structure shown in FIG. 4A as compared to in case of the transistor structure shown in FIG. 2A. Accordingly the transistor structure as shown in FIG. 4A in which the device isolation trench 2b is formed with a distance d=1 μm or more from the active transistor area Qu has an advantage in minimizing characteristic variations among the transistors due to heat generation as compared to the prior art transistor structure as shown in FIG. 2A.

As another variation of this embodiment, it may be possible to incorporate both of the transistor structures of FIG. 2A and FIG. 4A on the same substrate in which an emitter-ground amplifier, which requires a high speed operation with a resistive load, is configured with the transistor structure of FIG. 2A, and an output buffer is configured with the transistor structure of FIG. 4A thereby to make it possible to prevent from breakdown or destruction of the transistor structure due to a thermal runaway without unnecessary increase of areas for layout of circuits on the substrate, which increase may causes deterioration of characteristics of the transistors.

Embodiment 3

FIGS. 13A to 13D are plan views showing other embodiment regarding the method of extending the device isolation trench 2b in the unit transistor Qu.

Figure 13A:
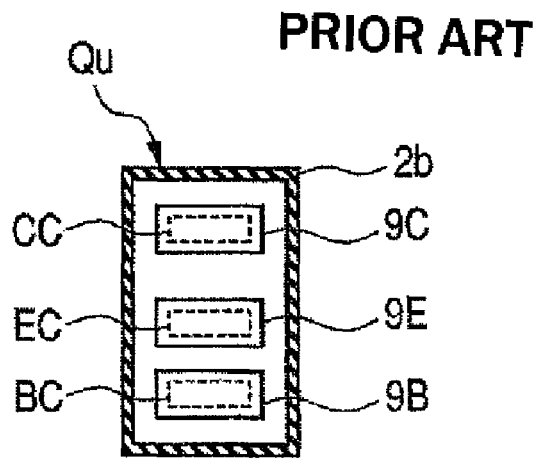
FIG. 13A is a plan view of the unit transistor shown in FIGS. 1A and 1B, and FIGS. 13B to 13D are plan views for the unit transistor as an embodiment of the invention.

FIG. 13A is a plan view of an existent structure.

Figure 13B:
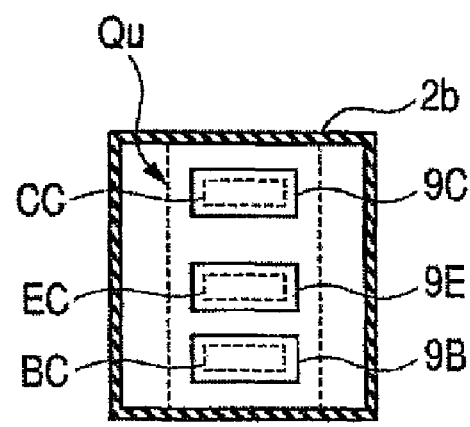
Figure 13C:
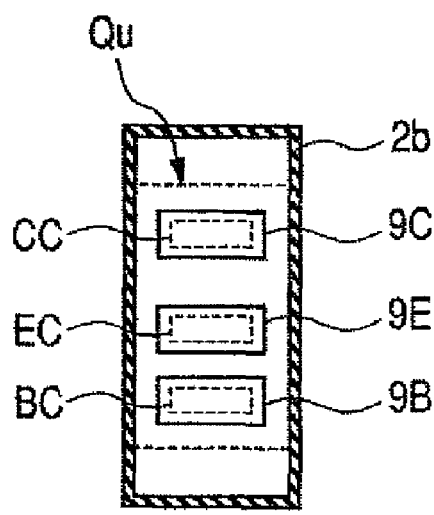
Figure 13D:
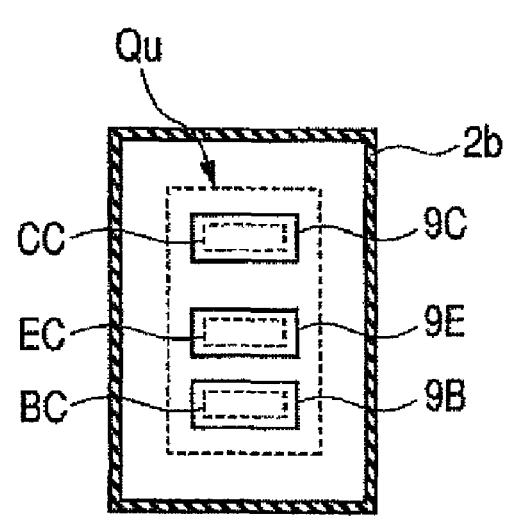

FIG. 13B, FIG. 13C, and FIG. 13D show embodiments of extending the device isolation trench 2b. The method of extending the device isolation trench 2b may be applied either only in the direction of row only in the direction of column or further, a combination thereof. Further, the size can be designed to the necessary minimum in view of FIGS. 5A and 5D.

Embodiment 4

Figure 14A:
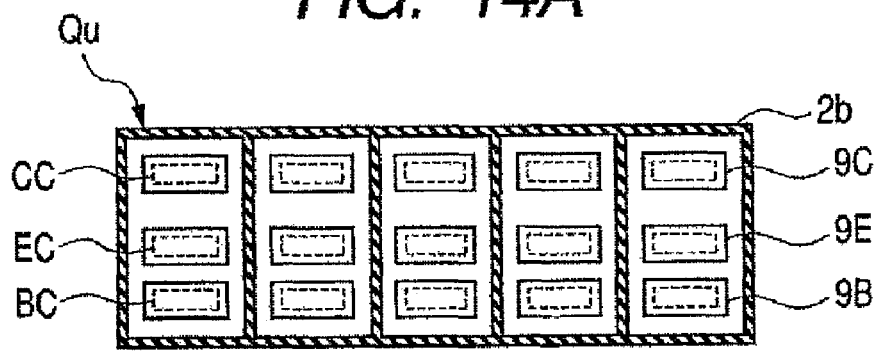
FIG. 14A is a plan view in a case of connecting in parallel a plurality of unit transistors shown in FIGS. 1A and 1B.
Figure 14B:
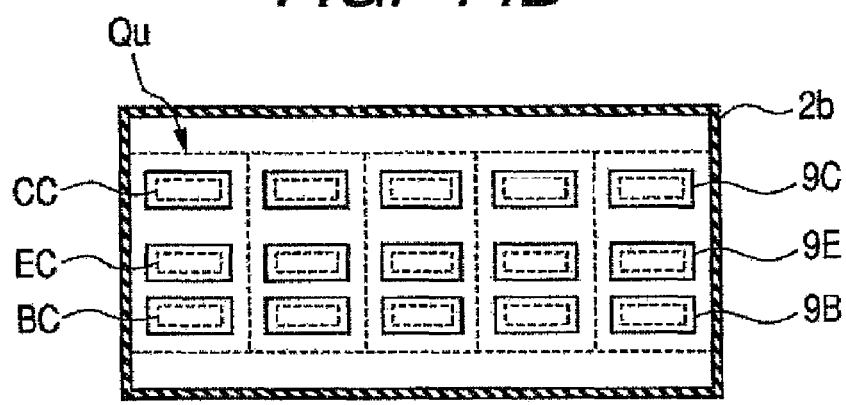
FIG. 14B and FIG. 14C are plan views in which a plurality of unit transistors as one embodiment of the invention are entirely surrounded with a device isolation trench.
Figure 14C:
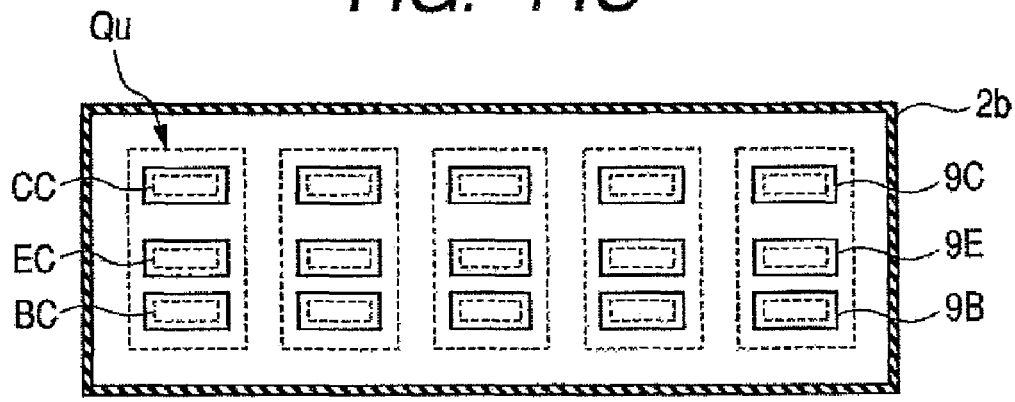

FIGS. 14A to 14C are plan views showing embodiments in a case of connecting a plurality of unit transistors Qu in parallel only in one direction. It is assumed here that each of the unit transistors Qu is connected in parallel by means of interconnections.

FIG. 14A is a plan view of an existent structure in which each of the unit transistors Qu has a device isolation trench 2b.

FIG. 14B and FIG. 14C show embodiments of removing the device isolation trench 2b for each of the unit transistors Qu and surrounding a plurality of unit transistors Qu connected in parallel entirely with one device isolation trench 2b.

Embodiment 5

Figure 15A:
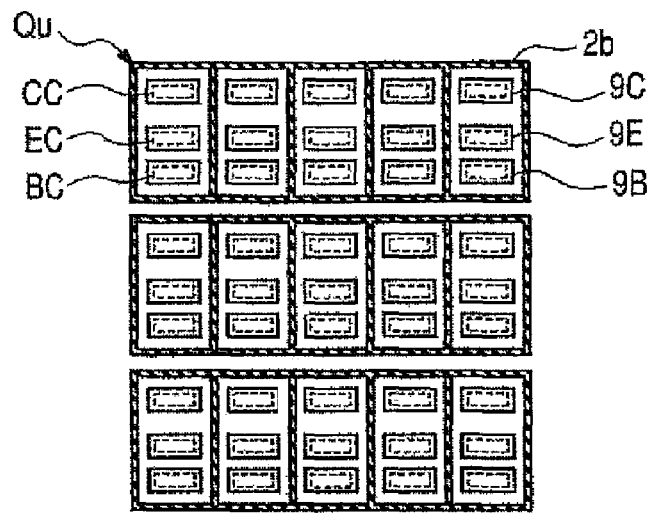
FIG. 15A is a plan view in a case of connecting in parallel a plurality of unit transistors shown in FIGS. 1A and 1B.
Figure 15B:
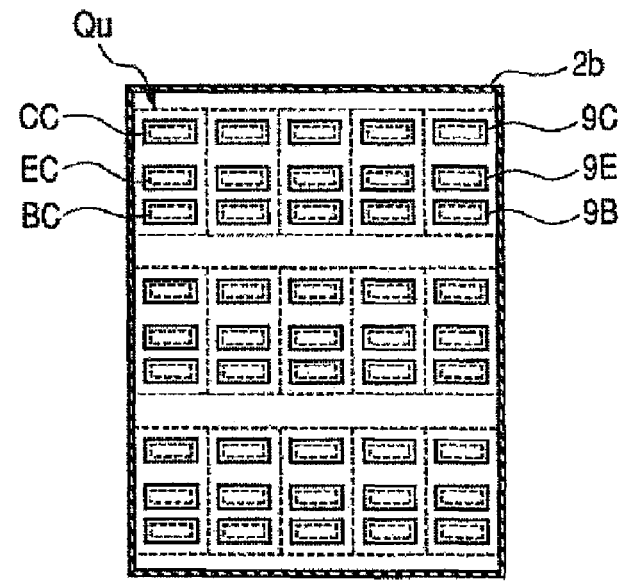
FIG. 15B and FIG. 15C are plan views in which a plurality of unit transistors as an embodiment of the invention are entirely surrounded with one device isolation trench.
Figure 15C:
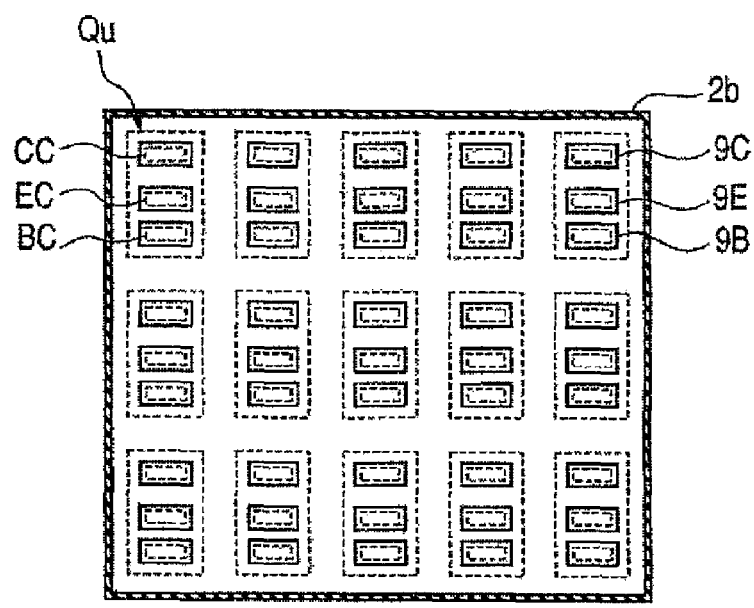

FIGS. 15A to 15C are plan views showing an embodiment in a case of connecting in parallel a plurality of unit transistors Qu in the direction of row and in the direction of column. Each of the unit transistors Qu is connected in parallel by interconnections.

FIG. 15A is a plan view of an existent structure in which each of the unit transistors Qu has a device isolation trench 2b.

FIG. 15B and FIG. 15C show embodiments in a case of removing the device isolation trench 2b for each of the unit transistors Qu and surrounding the plurality of unit transistors Qu connected in parallel entirely with one device isolation trench 2b.

Embodiment 6

Figure 16A:
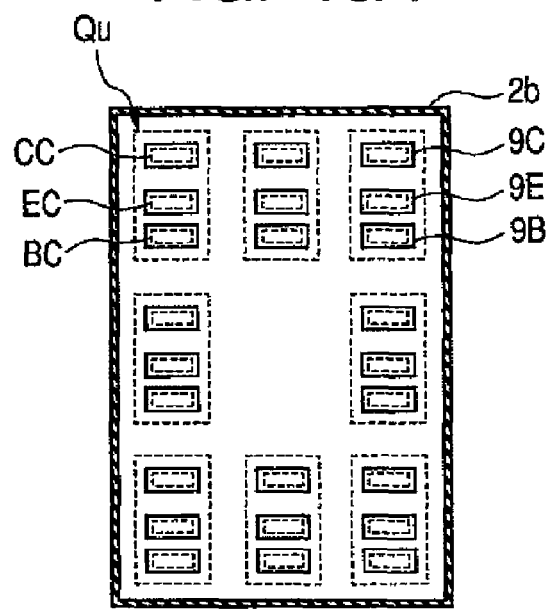
FIG. 16A and FIG. 16B are plan views in which a plurality of unit transistors connected in parallel as an embodiment according to the invention are entirely surrounded with one device isolation trench, and the unit transistors are arranged densely in the peripheral portion and thinly in the central portion.
Figure 16B:
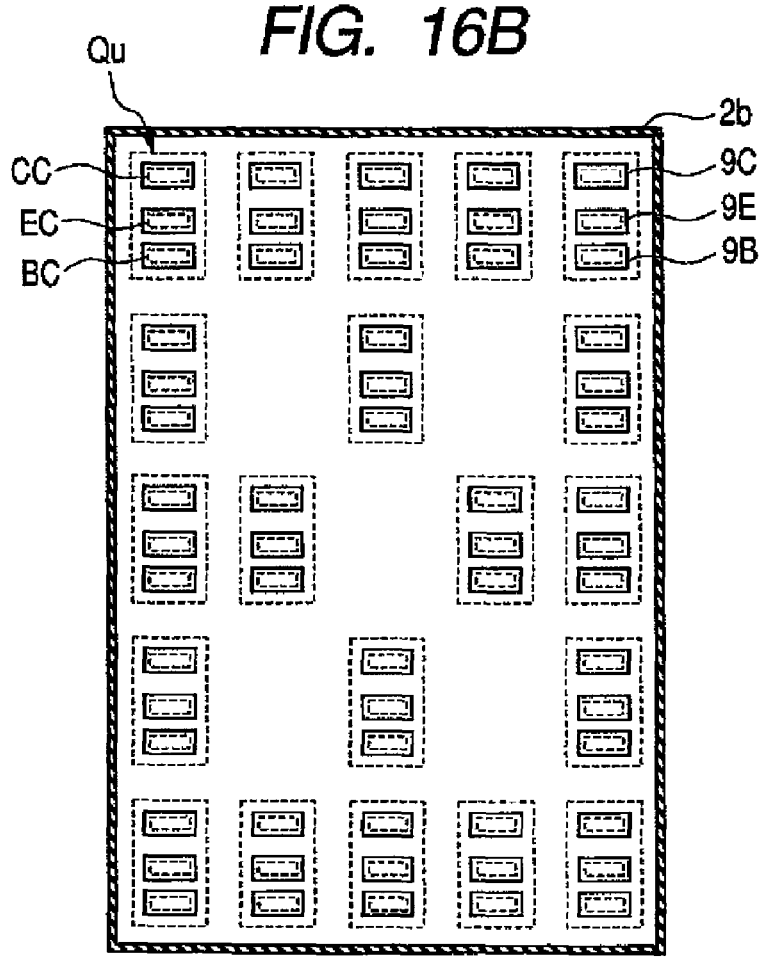

FIGS. 16A and 16B are plan views showing other embodiment in a case of connecting a plurality of unit transistors Qu in parallel in the direction of row and in the direction of column. It is assumed here that each of the unit transistors Qu is connected in parallel by interconnections.

As a result of thermal analysis, it has been found that the amount of heat generation of the unit transistors Qu situated in the central portion is higher compared with that in the peripheral portion.

FIG. 16A and FIG. 16B show embodiments of removing the device isolation trench 2b from each of the first unit transistors Qu and surrounding the plurality of unit transistors Qu connected in parallel entirely with one device isolation trench 2b and, further, arranging each of the unit transistors Qu densely in the peripheral portion and thinly in the central portion. With arrangement described above, the scattering of the thermal resistance between each of the unit transistors Qu can be decreased.

Embodiment 7

Figure 17A:
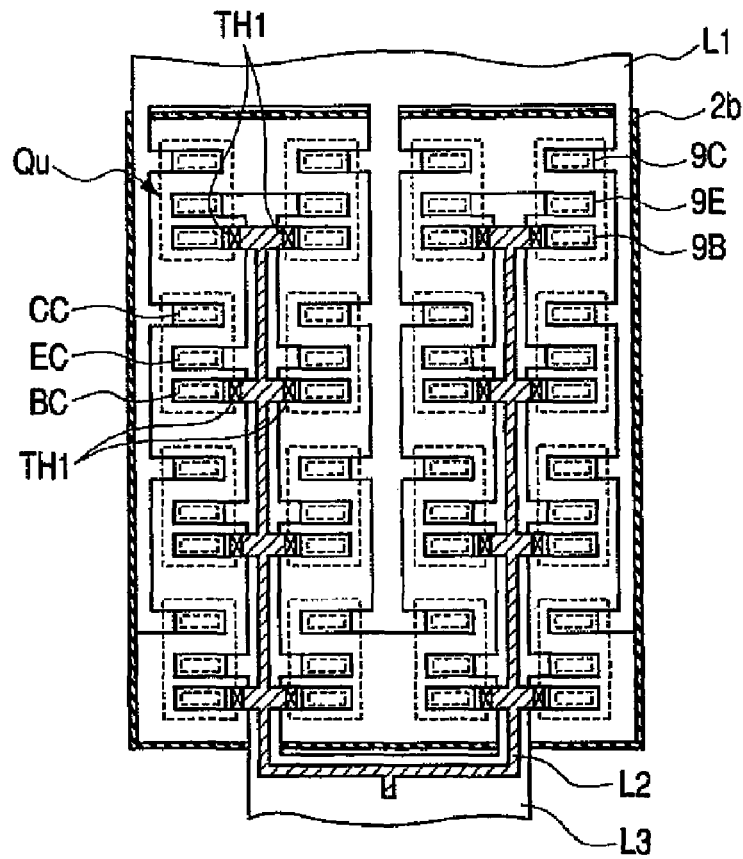
FIG. 17A is a plan view in which a plurality of unit transistors connected in parallel as an embodiment of the invention are entirely surrounded with one device isolation trench, emitter interconnection is extended in the direction of each of the columns, and the unit transistors in the direction of each column are disposed by the number more than that of the unit bipolar transistors in the direction of each row.
Figure 17B:
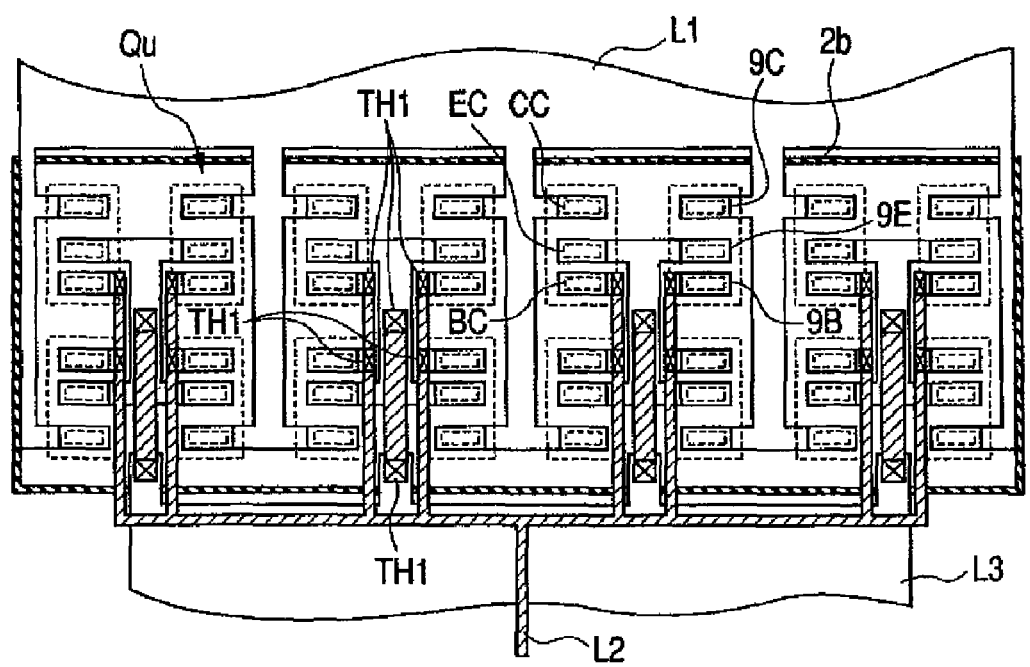
FIG. 17B is a plan view in which a plurality of unit transistors connected in parallel as an embodiment of the invention are entirely surrounded with one device isolation trench, emitter interconnection is extended in the direction of each of the columns, and the unit transistors in the direction of each column are disposed by the number less than that of the unit bipolar transistors in the direction of each row.

FIGS. 17A and 17B are plan views showing a further embodiment in a case of connecting a plurality of unit transistors Qu in parallel in the direction of row and in the direction of column. In this embodiment, emitter interconnections L3 are extended in the direction of each column. In a case of extending the emitter interconnection L3 in the direction of each column, as shown in FIG. 17B, it is preferred to adopt a structure in which the unit transistors in the direction of each column are disposed by the number less than the number of the unit transistors dispatch in the direction of each row. Further, the interconnection length from an emitter voltage supply portion to the emitter electrode for each of the unit transistors is formed as an equivalent length interconnection.

Due to the arrangement and interconnection structure of the unit transistors Qu as shown in FIG. 17B, the scattering for the emitter-base voltage VBE due to the parasitic resistance of the emitter interconnection can be decreased and this is a structure capable of preventing the device destruction due to the thermal runaway under the self-heating effect of the unit transistors Qu disposed at a portion with low parasitic resistance of the emitter interconnection.

Embodiment 8

Figure 18A:
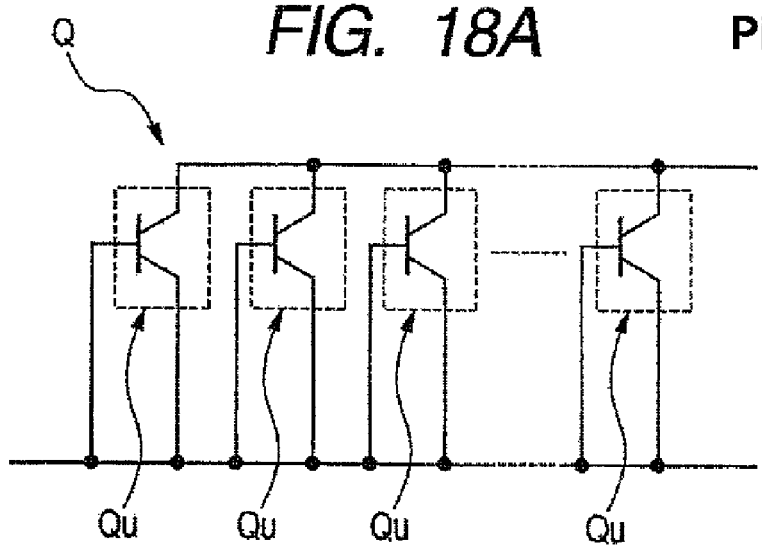
FIG. 18A is a circuit diagram in the case where a plurality of unit transistors whose emitter-base are connected by interconnections shown in FIG. 1A are connected in parallel with each other.
Figure 18B:
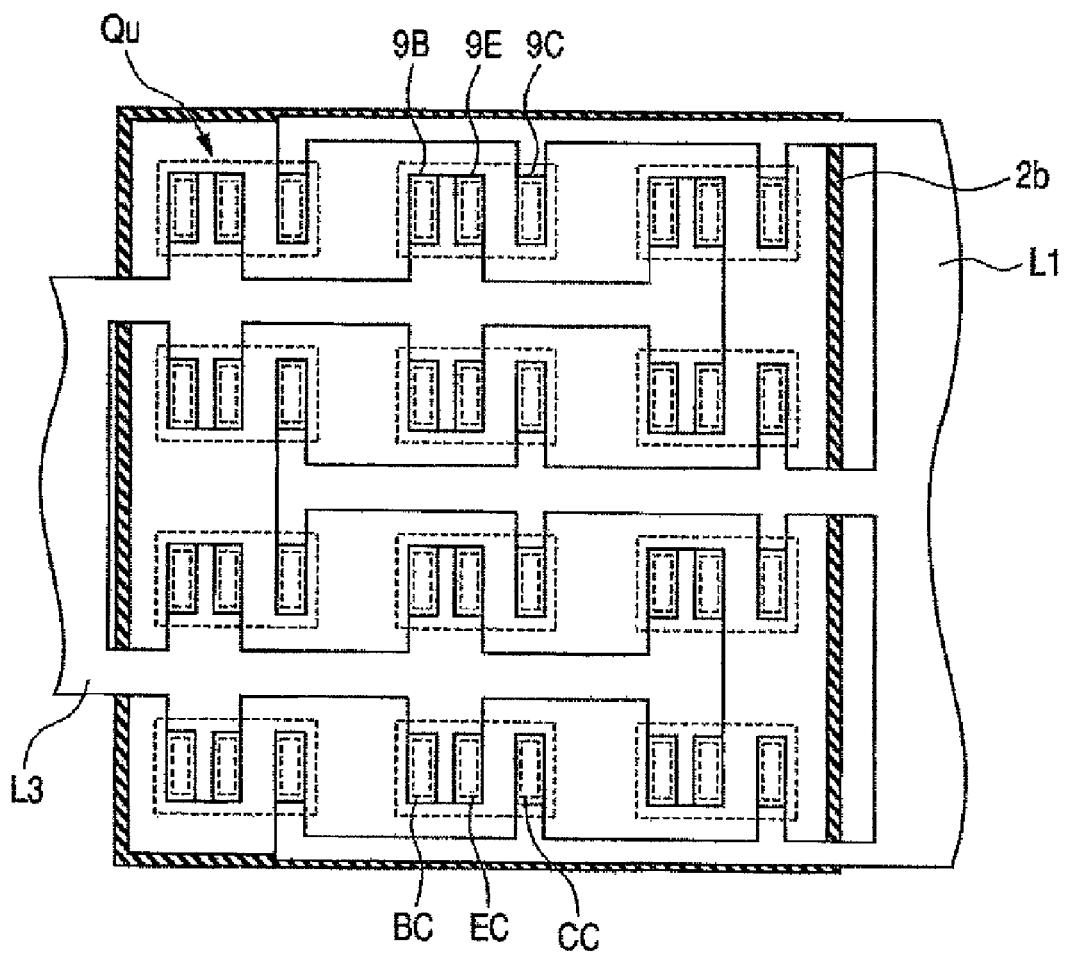
FIG. 18B is a plan view in a case of removing individual device isolation trenches for the unit transistors shown in the circuit diagram and the unit transistors connected in parallel entirely with one device isolation trench.

FIGS. 18A and 18B show a further embodiment in a case of connecting in parallel a plurality of unit transistors Qu shown in FIGS. 9A and 9B. This is an embodiment of connecting the emitters and the bases of the unit transistors shown in FIG. 9 by way of an interconnection L3, and using them as diodes. FIG. 18A is a circuit diagram for connecting a plurality of unit transistors Qu in parallel in which the emitters and the bases are connected by means of an interconnection and FIG. 18B is a plan view. The scattering of the thermal resistance between each of the unit transistors connected in parallel can be decreased in the same manner as in the embodiment of FIGS. 9A and 9B, and the capacitance relative to the substrate can also be decreased.

What we claim is:

1. A semiconductor device comprising:
    a semiconductor substrate including a lower substrate, a thin semiconductor layer formed over said lower substrate, and an insulating layer formed between said lower substrate and said semiconductor layer so as to electrically insulate the thin semiconductor layer from the lower substrate;
    an active transistor area formed at a part of said thin semiconductor layer with a base region formed along a surface of the thin semiconductor layer, an emitter region formed in said base region, a buried collector region buried in said thin semiconductor layer so as to contact said insulating layer, a collector region contacting said buried collector region, an emitter contact electrically connected to said emitter region, a base contact electrically connected to said base region and a collector contact electrically connected to said buried collector region via said collector region, the active transistor area being configured to operate at an emitter current at least in the order of mA (milli-ampere); and
    an isolation trench extending through said thin semiconductor layer to contact said insulating layer and surrounding said active transistor area with a distance in the order of μm (micron) from the active transistor area and with a space area of more than 50 μm² provided between the active transistor area and said isolation trench.

2. A semiconductor device according to claim 1, wherein the distance of said isolation trench from the active transistor area is at least 1 μm.

3. A semiconductor device according to claim 1, wherein the distance of said isolation trench from the active transistor area is at least 2 μm.

4. A semiconductor device according to claim 1, wherein buried collector region is formed correspondingly to said active transistor area spacedly from said isolation trench.

5. A semiconductor device comprising:
    a semiconductor substrate including a lower substrate, a thin semiconductor layer formed over said lower substrate, and an insulating layer formed between said lower substrate and said semiconductor layer so as to electrically insulate the thin semiconductor layer from the lower substrate;
    a plurality of active transistor areas configured to have the same size and each formed at a part of said thin semiconductor layer with a base region formed along a surface of the thin semiconductor layer, an emitter region formed in said base region, a buried collector region buried in said thin semiconductor layer so as to contact said insulating layer, a collector region contacting said buried collector region, an emitter contact electrically connected to said emitter region, a base contact electrically connected to said base region and a collector contact electrically connected to said buried collector region via said collector region, each of the active transistor areas being configured to operate at an emitter current at least in the order of mA (milli-ampere);
    emitter connection means commonly connecting said emitter contacts and collector connection means commonly connecting said corrector contacts thereby to configure a transistor to operate at a collector current in total at least in the order of several 10 mA; and
    an isolation trench extending through said thin semiconductor layer to contact said insulating layer and surrounding said plurality of active transistor areas with a distance in the order of μm (micron) from the active transistor areas and with a space area of more than 50 μm² provided between the active transistor area and said isolation trench.

* * * * *